(12) United States Patent
Choi et al.

(10) Patent No.: US 11,616,081 B2
(45) Date of Patent: Mar. 28, 2023

(54) THREE-DIMENSIONAL SEMICONDUCTOR MEMORY DEVICE INCLUDING FERROELECTRIC THIN FILM AND MANUFACTURING METHOD OF THE SAME

(71) Applicant: Samsung Electronics Co., Ltd., Suwon-si (KR)

(72) Inventors: Chang Hwan Choi, Seoul (KR); Yun Heub Song, Seongnam-si (KR); Bon Cheol Ku, Seoul (KR)

(73) Assignee: SAMSUNG ELECTRONICS CO., LTD.

(*) Notice: Subject to any disclaimer, the term of this patent is extended or adjusted under 35 U.S.C. 154(b) by 0 days.

(21) Appl. No.: 17/346,370

(22) Filed: Jun. 14, 2021

(65) Prior Publication Data
US 2022/0392918 A1 Dec. 8, 2022

(30) Foreign Application Priority Data
Jun. 4, 2021 (KR) .................. 10-2021-0072986

(51) Int. Cl.
| | |
|---|---|
| H01L 27/11597 | (2017.01) |
| H01L 27/1159 | (2017.01) |
| H01L 21/02 | (2006.01) |
| H01L 29/51 | (2006.01) |
| H01L 21/28 | (2006.01) |
| H01L 29/24 | (2006.01) |

(52) U.S. Cl.
CPC .. H01L 27/11597 (2013.01); H01L 21/02565 (2013.01); H01L 27/1159 (2013.01);
(Continued)

(58) Field of Classification Search
None
See application file for complete search history.

(56) References Cited

U.S. PATENT DOCUMENTS

| | | | | |
|---|---|---|---|---|
| 5,543,943 A | * | 8/1996 | Hanyu | G02F 1/1416 349/20 |
| 6,159,829 A | * | 12/2000 | Warren | G11C 13/04 438/257 |

(Continued)

FOREIGN PATENT DOCUMENTS

| | | |
|---|---|---|
| JP | 06-148703 A | 5/1994 |
| KR | 1999-0075997 A | 10/1999 |

(Continued)

OTHER PUBLICATIONS

Young Hawn Lee, "Preparation and characterization of ferroelectric Hf0.5Zr0.5O2 films by RF sputtering method", Seoul National University, Aug. 2016, 91 pages.

(Continued)

*Primary Examiner* — Vincent Wall
(74) *Attorney, Agent, or Firm* — Myers Bigel, P.A.

(57) ABSTRACT

Disclosed is a method of manufacturing a three-dimensional semiconductor memory device including a ferroelectric thin film. The method includes forming a mold structure including interlayer dielectric layers and sacrificial layers alternately stacked on a substrate, forming channel holes penetrating the mold structure, forming vertical channel structures inside the channel holes, forming an isolation trench penetrating the mold structure and having a line shape extending in one direction, selectively removing the sacrificial layers exposed by the isolation trench, forming gate electrodes filling a space from which the sacrificial layers are removed, and performing a heat treatment process and a cooling process for the vertical channel structures.

9 Claims, 24 Drawing Sheets

(52) U.S. Cl.
CPC ........ *H01L 29/24* (2013.01); *H01L 29/40111* (2019.08); *H01L 29/516* (2013.01)

(56) References Cited

U.S. PATENT DOCUMENTS

| | | |
|---|---|---|
| 6,828,190 B2 | 12/2004 | Lee et al. |
| 8,120,082 B2 | 2/2012 | Park |
| 10,490,571 B2* | 11/2019 | Yoo .................... H01L 27/11514 |
| 10,784,362 B2 | 9/2020 | Lu et al. |
| 10,923,502 B2* | 2/2021 | Sato .................... H01L 27/1159 |
| 11,482,269 B2* | 10/2022 | Suzuki .............. H01L 27/11514 |
| 11,515,330 B2* | 11/2022 | Chen ................. H01L 27/11597 |
| 2019/0371500 A1 | 12/2019 | Motoki et al. |

FOREIGN PATENT DOCUMENTS

| | | |
|---|---|---|
| KR | 10-2012-0012915 A | 2/2012 |
| KR | 10-2018-0013091 A | 2/2018 |
| KR | 10-2019-0049398 A | 5/2019 |
| KR | 10-2019-0122683 A | 10/2019 |

OTHER PUBLICATIONS

Hyung Suk Yu, "Performance Evaluation and Improvement of Ferroelectric Field-Effect Transistor Memory", UCLA, University of California, 2015, Los Angeles, 115 pages.

Boncheol Ku et al., "Fast Thermal Quenching on the Ferroelectric Al:Hf02Thin Film with Record Polarization Density and Flash Memory Application", 2020 Symposium on VLSI Technology Digest of Technical Papers-TF2.5, 2020, 2 pages.

* cited by examiner

THREE-DIMENSIONAL SEMICONDUCTOR MEMORY DEVICE INCLUDING FERROELECTRIC THIN FILM AND MANUFACTURING METHOD OF THE SAME

CROSS-REFERENCE TO RELATED APPLICATIONS

This U.S. non-provisional patent application claims priority under 35 U.S.C. § 119 of Korean Patent Application No. 10-2021-0072986, filed on Jun. 4, 2021, the entire contents of which are hereby incorporated by reference.

BACKGROUND

The inventive concept relates to a three-dimensional semiconductor memory device including a ferroelectric thin film and a method for manufacturing the same, and more particularly, to a method for manufacturing a ferroelectric thin film with improved ferroelectric properties through a quenching-based process after heat treatment, and a three-dimensional semiconductor memory device including a ferroelectric thin film manufactured through the method and a method for manufacturing the same.

In order to meet the high performance and low price demanded by consumers, it is required to increase the degree of integration of semiconductor devices. In the case of a semiconductor device, since the degree of integration is an important factor in determining the price of a product, an increased degree of integration is particularly required. In the case of a two-dimensional or planar semiconductor device, since the degree of integration is mainly determined by an area occupied by a unit memory cell, it is greatly affected by the level of a fine pattern forming technique. However, since ultra-expensive equipment is required for pattern miniaturization, the degree of integration of the two-dimensional semiconductor device is increasing, but is still limited. Accordingly, three-dimensional semiconductor memory devices including three-dimensionally arranged memory cells have been proposed.

On the other hand, some dielectrics may remain polarized even after the application of an external electric field is finished, and this property is called ferroelectricity, and a material having ferroelectricity is called a ferroelectric. In addition, the polarization remaining after the external electric field is applied is referred to as the residual polarization. The direction of the residual polarization depends on the direction of the external electric field. Residual polarization corresponding to logical values of 1 and 0 may be caused by changing the direction of the electric field perpendicular to the surface of the ferroelectric thin film by 180 degrees. This principle may be applied to non-volatile memory devices. Accordingly, research on a three-dimensional semiconductor memory device having an increased degree of integration among non-volatile memory devices using a ferroelectric thin film is being actively conducted.

SUMMARY

The present disclosure provides a method for manufacturing a ferroelectric thin film with improved ferroelectric properties, a three-dimensional semiconductor memory device including the ferroelectric thin film manufactured through the method, and a method for manufacturing the same.

An embodiment of the inventive concept provides a method of manufacturing a three-dimensional semiconductor memory device including a ferroelectric thin film, the method including: forming a mold structure including interlayer dielectric layers and sacrificial layers alternately stacked on a substrate; forming channel holes penetrating the mold structure; forming vertical channel structures inside the channel holes; forming an isolation trench penetrating the mold structure and having a line shape extending in one direction; selectively removing the sacrificial layers exposed by the isolation trench; forming gate electrodes filling a space from which the sacrificial layers are removed; and performing a heat treatment process and a cooling process for the vertical channel structures, wherein the forming of the vertical channel structures includes: forming a data storage pattern configured to conformally cover an inner sidewall of each of the channel holes; and forming a vertical semiconductor pattern covering a sidewall of the data storage pattern, wherein the data storage pattern is formed of a ferroelectric thin film having a single-layer structure, wherein a cooling rate of the cooling process is −180 degrees/sec to −90 degrees/sec.

In an embodiment, the cooling process may be a process for quenching the vertical channel structures.

In an embodiment, the quenching may be a process for putting in deionized water (DI water) from which ions are removed.

In an embodiment, the heat treatment process may include heating to a first temperature for a first time interval and maintaining the first temperature for a second time interval.

In an embodiment, the first temperature may be 350 degrees to 900 degrees, wherein a ramping rate of the heat treatment process may be 17.5 degrees/sec to 45 degrees/sec.

In an embodiment, the heat treatment process and the cooling process may be performed after the forming of the gate electrodes.

In an embodiment, the method may further include: forming a common source area in the substrate exposed by the isolation trench; and forming an insulating spacer covering a sidewall of the isolation trench and a common source plug filling an internal space of the isolation trench surrounded by the insulating spacer.

In an embodiment, the forming of the vertical channel structures further may include recessing an upper portion of the vertical semiconductor pattern, and forming a conductive pad by filling a doped semiconductor material in a recessed area.

In an embodiment, the method may further include forming lower epitaxial layers in lower portions of the channel holes between the forming of the channel holes and the forming of the vertical channel structures.

In an embodiment of the inventive concept, a three-dimensional semiconductor memory device includes: a substrate; a stack structure provided on the substrate and including alternately stacked interlayer dielectric layers and gate electrodes; and vertical channel structures provided in channel holes penetrating the stack structure and extending in a direction perpendicular to an upper surface of the substrate, wherein each of the vertical channel structures includes: a data storage pattern configured to conformally cover an inner sidewall of the channel holes; and a vertical semiconductor pattern configured to cover a sidewall of the data storage pattern, wherein the data storage pattern is a ferroelectric thin film of a single-layer structure, wherein twice a residual polarization value of the data storage pattern is 80 µC/cm$^2$ to 120 µC/cm$^2$, wherein twice a coercive electric field value of the data storage pattern is 9 MV/cm to 10 MV/cm.

In an embodiment, the data storage pattern DSP may include at least one of $HfO_x$, PZT (Pb(Zr, Ti)$O_3$), PTO (PbTiO$_3$), SBT (SrBi$_2$Ti$_2$O$_9$), BLT (Bi(La, Ti)O$_3$), PLZT (Pb(La, Zr)TiO$_3$), BST (Bi(Sr, Ti)O$_3$), barium titanate (BaTiO$_3$), P(VDF-TrFE), PVDF, $AlO_x$, $ZnO_x$, $TiO_x$, $TaO_x$, or $InO_x$, doped with at least one impurity of Al, Gd, Si, Y, Zr, Sr, Sc, Ge, Ce, Ca, La, Sn, Dy, or Er.

In an embodiment, the vertical semiconductor pattern may include a material having a thermal expansion coefficient different from that of the data storage pattern.

In an embodiment, the vertical semiconductor pattern may include an oxide semiconductor material including at least one of In, Zn, or Ga or a group IV semiconductor material.

In an embodiment, the data storage pattern may have a pipe shape or macaroni shape whose bottom end is opened, wherein the vertical semiconductor pattern may have a pipe shape or macaroni shape whose bottom end is closed.

In an embodiment, an average grain radius of the data storage pattern may be 2.9 nm to 3.1 nm.

In an embodiment, an orthorhombic phase ratio of the data storage pattern may be 50% to 60%.

In an embodiment, the residual polarization value and the coercive electric field value of the data storage pattern may be measured when a voltage having a frequency of 1 kHz is applied to the data storage pattern.

In an embodiment, the stack structure may be provided in plurality, wherein the device may further include a common source plug provided in an isolation trench extending in a first direction between the stack structures, wherein the stack structures may be spaced apart from each other in a second direction crossing the first direction with the common source plug therebetween.

In an embodiment, each of the vertical channel structures may further include: a buried insulating pattern configured to fill a space surrounded by the vertical semiconductor pattern; and a conductive pad on the vertical semiconductor pattern and the buried insulating pattern.

In an embodiment, the data storage pattern may be formed through a heat treatment process and a cooling process, wherein a cooling rate of the cooling process may be −180 degrees/sec to −90 degrees/sec.

BRIEF DESCRIPTION OF THE FIGURES

The accompanying drawings are included to provide a further understanding of the inventive concept, and are incorporated in and constitute a part of this specification. The drawings illustrate embodiments of the inventive concept and, together with the description, serve to explain principles of the inventive concept. In the drawings.

DETAILED DESCRIPTION

Figure 1:
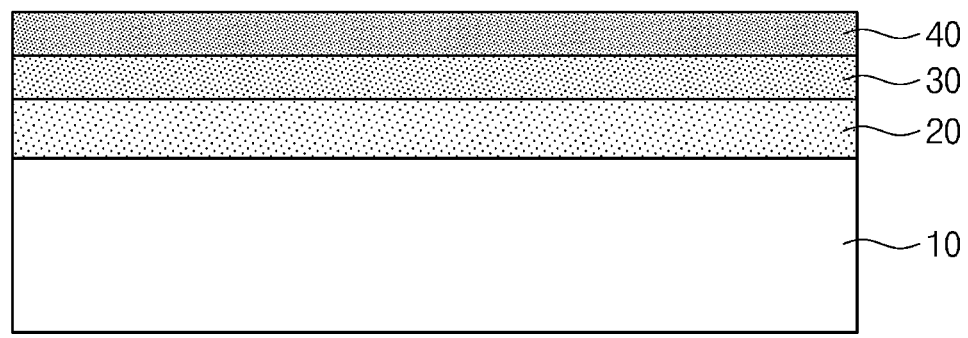
FIG. 1 is a cross-sectional view for explaining a method of manufacturing a ferroelectric thin film according to an embodiment of the inventive concept.

In order to fully understand the configuration and effects of the inventive concept, preferred embodiments of the inventive concept will be described in detail with reference to the accompanying drawings.

The inventive concept is not limited to the embodiments disclosed below, but may be implemented in various forms, and various modifications and changes may be added. However, it is provided to completely disclose the technical idea of the inventive concept through the description of the present embodiments, and to fully inform a person of ordinary skill in the art to which the inventive concept belongs. In the accompanying drawings, for convenience of description, the ratio of each component may be exaggerated or reduced.

The terms used in this specification are for describing embodiments and are not intended to limit the inventive concept. In addition, terms used in the present specification may be interpreted as meanings commonly known to those of ordinary skill in the art, unless otherwise defined.

In this specification, the singular form also includes the plural form unless specifically stated in the phrase. As used in the specification, in relation to 'comprises' and/or 'comprising', the mentioned elements, steps, operations and/or elements do not exclude the presence or addition of one or more other elements, steps, operations and/or elements.

In this specification, terms such as first and second are used to describe various areas, directions, shapes, etc., but these areas, directions, and shapes should not be limited by these terms. These terms are only used to distinguish one area, direction, or shape from another area, direction, or shape. Accordingly, a portion referred to as a first portion in one embodiment may be referred to as a second portion in another embodiment. The embodiments described and illustrated herein also include complementary embodiments thereof. Like reference numerals refer to like elements throughout the specification.

Hereinafter, a method of manufacturing a ferroelectric thin film according to an embodiment of the inventive concept, a three-dimensional semiconductor memory device including the ferroelectric thin film manufactured through the method, and a manufacturing method thereof will be described in detail with reference to the drawings.

Figure 2:
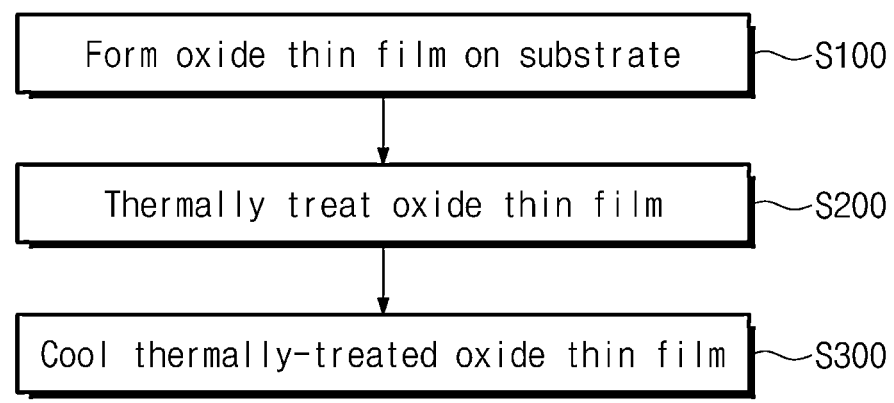
FIG. 2 is a flowchart illustrating a method of manufacturing a ferroelectric thin film according to an embodiment of the inventive concept.

FIG. 1 is a cross-sectional view for explaining a method of manufacturing a ferroelectric thin film according to an embodiment of the inventive concept. FIG. 2 is a flowchart illustrating a method of manufacturing a ferroelectric thin film according to an embodiment of the inventive concept.

Referring to FIGS. 1 and 2, the method for manufacturing a ferroelectric thin film according to the inventive concept includes forming an oxide thin film 20 on a substrate 10 (S100), and heat-treating the oxide thin film 20 (S200) and, cooling the heat-treated oxide thin film 20 (S300).

The method of manufacturing the ferroelectric thin film according to the inventive concept may further include sequentially forming the first conductive layer 30 and the second conductive layer 40 on the oxide thin film 20 between forming the oxide thin film 20 on the substrate 10 (S100) and heat-treating the oxide thin film 20 (S200). However, this is merely exemplary, and the inventive concept is not limited thereto. The method for manufacturing a ferroelectric thin film according to the inventive concept may further include, for example, washing the upper surface of the substrate 10 before forming the oxide thin film 20 on the substrate 10 (S100). As another example, the method of manufacturing a ferroelectric thin film according to the inventive concept may further include forming a third conductive layer on the substrate 10. As another example, after sequentially forming the first conductive layer 30 and the second conductive layer 40 on the oxide thin film 20, the method of manufacturing a ferroelectric thin film according to the inventive concept may further include forming a mask pattern on the second conductive layer 40 and patterning the first conductive layer 30 and the second conductive layer 40 through a photolithography process. Hereinafter, a method of manufacturing a ferroelectric thin film including sequentially forming the first conductive layer 30 and the second conductive layer 40 on the oxide thin film 20 and the characteristics of the ferroelectric thin film manufactured through this method will be described.

The substrate 10 may be a semiconductor substrate. The substrate 10 may include, for example, at least one of Si, SiGe, Ge, Poly-Si, SOI, GaAs, InP, InGaAs, IGZO, IGO, GaN, or SiC.

The oxide thin film 20 may be formed through, for example, an atomic layer deposition (ALD) process. The oxide thin film 20 may include, for example, an oxide of any one of $HfO_2$ or $ZrO_2$ doped with at least one impurity of Al, Gd, Si, Y, Zr, Sr, Sc, Ge, Ce, Ca, La, Sn, Dy or Er. In other words, forming the oxide thin film 20 on the substrate 10 includes depositing an oxide of either $HfO_2$ or $ZrO_2$ on the substrate 10 through an ALD process and Al, Gd, Si, and adding at least one impurity of Y, Zr, Sr, Sc, Ge, Ce, Ca, La, Sn, Dy, or Er. Hereinafter, a case in which the oxide thin film 20 includes $HfO_2$ doped with Al will be described, but this is merely exemplary and the inventive concept is not limited thereto.

Each of the first conductive layer 30 and the second conductive layer 40 may be formed through, for example, a sputtering process or a plasma-enhanced atomic layer deposition (PEALD) process. The thermal expansion coefficient of the first conductive layer 30 in direct contact with the oxide thin film 20 may be different from the thermal expansion coefficient of the oxide thin film 20. Each of the first conductive layer 30 and the second conductive layer 40 may include, for example, at least one selected from a doped semiconductor (e.g., doped silicon, etc.), a metal (e.g., W, Cu, Al, etc.), a conductive metal nitride (e.g., TiN, TaN, etc.) or a transition metal (e.g., Ti, Ta, etc.). Hereinafter, a case in which the first conductive layer 30 includes TiN and the second conductive layer 40 includes W will be described, but this is merely exemplary and the inventive concept is not limited thereto.

Figure 3:
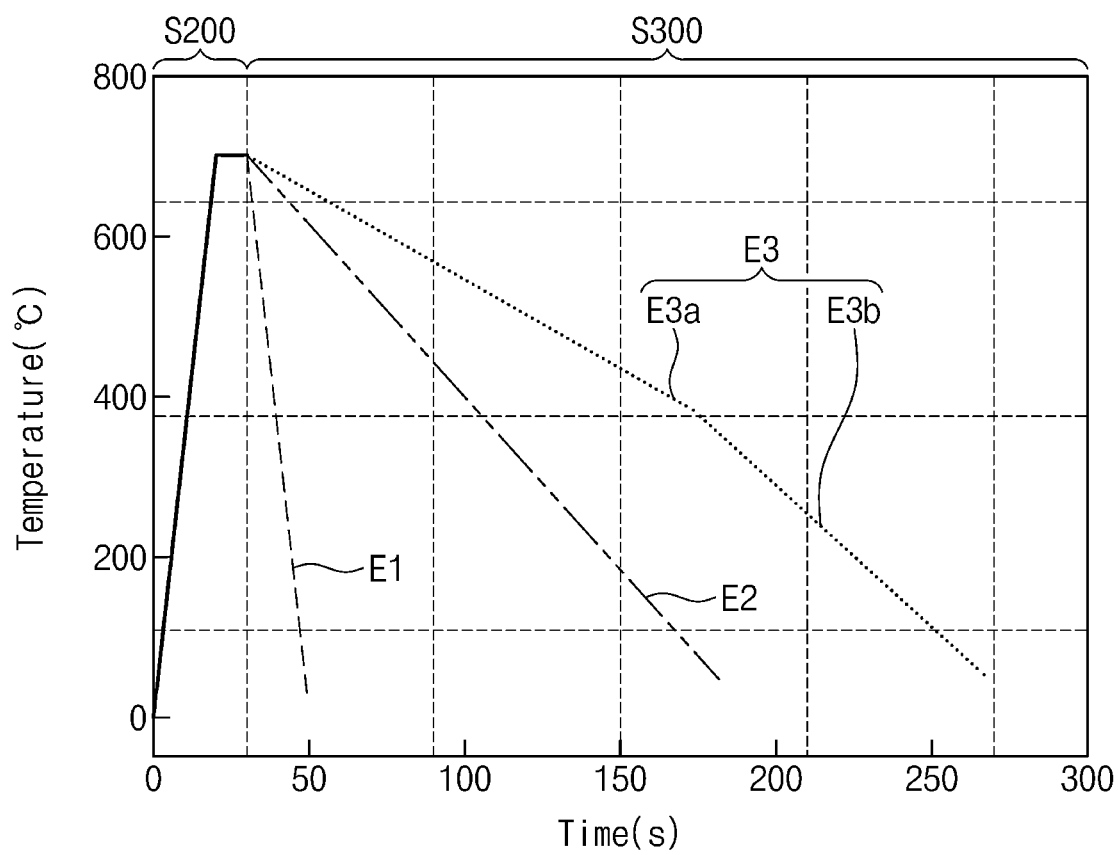
FIG. 3 is a graph for explaining and comparing the difference between a cooling process according to the embodiment of the inventive concept and a cooling process according to the comparative examples.

Heat-treating the oxide thin film 20 (S200) may be performed, for example, in an $N_2$ atmosphere. Heat-treating the oxide thin film 20 (S200) includes, for example, heating the oxide thin film 20 to a first temperature for a first time interval and maintaining the first temperature for a second time interval. The first temperature may be, for example, about 350 degrees to about 900 degrees. The ramping rate may be, for example, about 17.5 degrees/sec to about 45 degrees/sec. Referring to FIG. 3, the first time interval may be about 20 seconds, the second time interval may be about 10 seconds, the ramping rate may be about 35 degrees/sec, and the first temperature may be about 700 degrees.

Cooling the heat-treated oxide thin film 20 (S300) may be quenching based on quenching of the oxide thin film 20. A cooling rate of the oxide thin film 20 may be, for example, about −180 degrees/sec to about −30 degrees/sec. The cooling rate of the oxide thin film 20 may be, preferably, about −180 degrees/sec to about −70 degrees/sec, more preferably, about −180 degrees/sec to about −90 degrees/sec. When the cooling rate of the oxide thin film 20 is faster than −180 degrees/sec, the substrate 10 may be damaged due to thermal stress.

Quenching may mean, for example, putting the oxide thin film 20 in deionized (DI) water from which ions are removed, but the inventive concept is not limited thereto, and various cooling processes capable of achieving a cooling rate within the above-described range may be used in the method for manufacturing the ferroelectric thin film according to the inventive concept.

The oxide thin film 20 may have an orthorhombic phase structure exhibiting ferroelectricity through a heat treatment process S200 and a cooling process S300. More specifically, by the difference in the coefficient of thermal expansion of the oxide thin film 20 and the first conductive layer 30 (or the second conductive layer 40), a compressive stress may act on the first conductive layer 30 (or the second conductive layer 40), and accordingly, tensile stress may be applied to the oxide thin film 20 to form an orthorhombic phase. That is, the ferroelectric thin film may be manufactured by the heat treatment process S200 and the cooling process S300 of the oxide thin film 20.

The ferroelectric thin film manufactured through the above-described heat treatment process S200 and cooling process S300 may better maintain the orthorhombic phase structure so that it may have a very high residual polarization $P_r$ value and a coercive electric field $E_c$ value. Twice $2P_r$ of the residual polarization $P_r$ value of the ferroelectric thin film may be, for example, about 80 μC/cm$^2$ to about 120 μC/cm$^2$, and twice 2E of the coercive field $E_c$ value of the ferroelectric thin film may be, for example, about 9 MV/cm to about 10 MV/cm. In addition, the orthorhombic phase ratio of the ferroelectric thin film may be about 50% to about 60%, preferably, about 54% to about 56%. The average grain radius of the ferroelectric thin film may be about 2.5 nm to about 3.1 nm, and preferably, about 2.9 nm to about 3.1 nm.

FIG. 3 is a graph for explaining and comparing the difference between a cooling process according to the embodiment of the inventive concept and a cooling process according to the comparative examples. The horizontal axis is time and the unit is seconds (sec). The vertical axis is temperature and the unit is Celsius (° C.).

Referring to FIG. 3, a cooling process S300 may be performed after the heat treatment process S200. Hereinafter, the cooling process according to an embodiment of the inventive concept is referred to as a first cooling process E1, the cooling process according to the first comparative example is referred to as a second cooling process E2, and the cooling process according to the second comparative example is referred to as a third cooling process E3.

The first cooling process E1 may be a quenching process based on the above-described quenching, and the cooling rate of the first cooling process E1 may be, for example, about −180 degrees/sec to about −30 degrees/sec, preferably, about −180 degrees/sec to about −70 degrees/sec, more preferably, about −180 degrees/sec to about −90 degrees/sec. The cooling rate of the first cooling process E1 may be faster than the cooling rate of the second cooling process E2 and the cooling rate of the third cooling process E3.

The second cooling process E2 may be a cooling process in air (i.e., air cooling), and the cooling rate of the second cooling process E2 may be about −5 degrees/sec to about −4 degrees/sec, for example, about −4.3 degrees/sec. In addition, the third cooling process E3 may be a cooling process in the chamber (i.e., chamber cooling), and the cooling rate of the third cooling process E3 may be about −3 degrees/sec to about −2 degrees/sec. More specifically, the third cooling process E3 may include cooling to 150 degrees inside the chamber E3a and cooling to 25 degrees outside the chamber E3b. The cooling rate inside the chamber may be, for example, about −2.3 degrees/sec, and the cooling rate outside the chamber may be, for example, about −2.7 degrees/sec.

FIGS. 4A, 4B, 5A, 5B, 6A to 6D, and 8D show the characteristics of a ferroelectric thin film manufactured through a cooling process according to an embodiment of the inventive concept and a characteristic of a ferroelectric thin film manufactured through a cooling process according to comparative examples. FIGS. 7A to 7C and 8A to 8C are photographs for explaining the comparison between the characteristics of the ferroelectric thin film manufactured through the cooling process according to the embodiment of the inventive concept and the characteristics of the ferroelectric thin film manufactured through the cooling process according to the comparative examples. Hereinafter, referring to FIGS. 4A, 4B, 5A, 5B, 6A to 6D, 7A to 7C, and 8A to 8D, the characteristics of the ferroelectric thin film manufactured through the cooling process according to each of examples and comparative examples of the inventive concept will be compared and described.

Figure 4A:
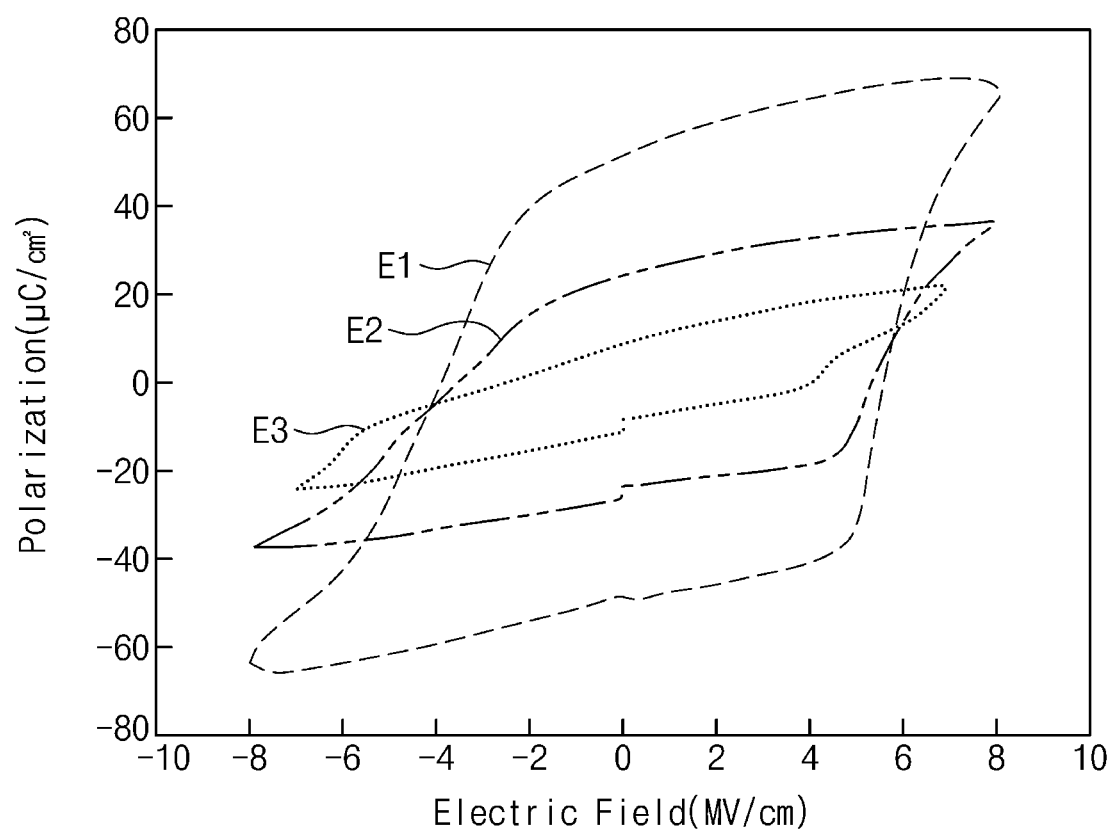
FIGS. 4A, 4B, 5A, 5B, 6A to 6D, and 8D show the characteristics of a ferroelectric thin film manufactured through a cooling process according to an embodiment of the inventive concept and a characteristic of a ferroelectric thin film manufactured through a cooling process according to comparative examples.
Figure 4B:
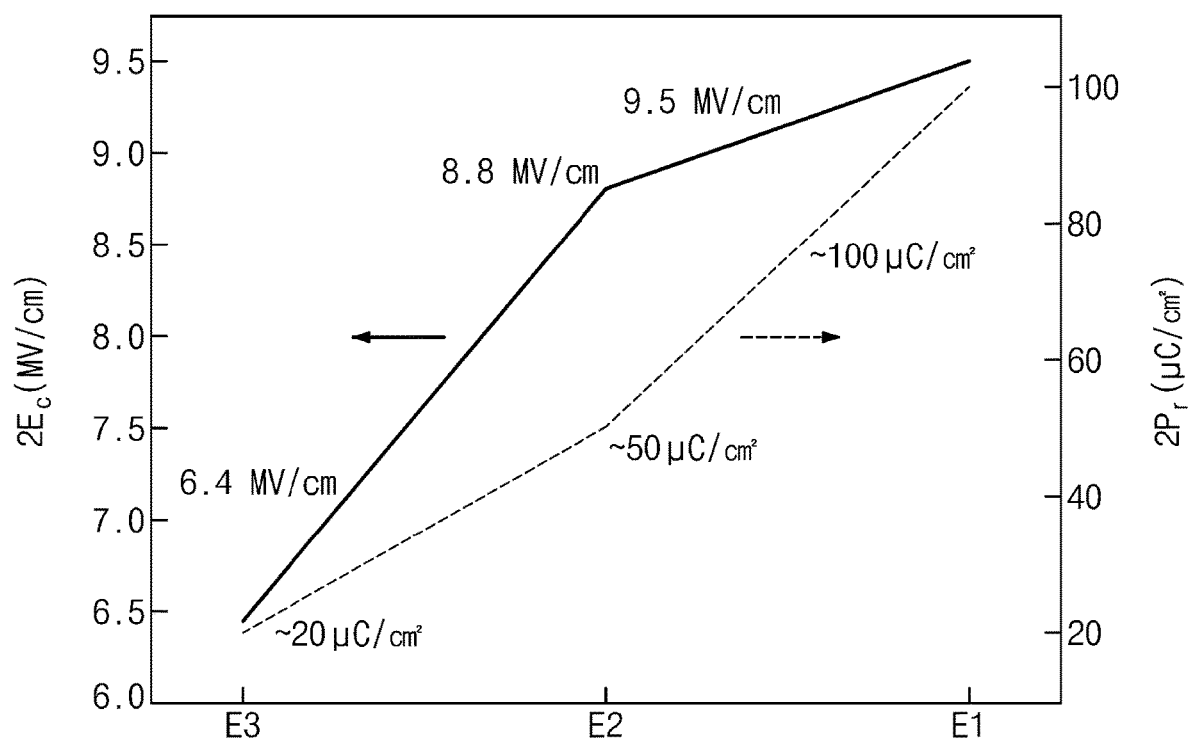

Referring to FIGS. 4A and 4B, hysteresis loops of the ferroelectric thin films manufactured through the first to third cooling processes E1, E2, and E3 are illustrated. The horizontal axis is the electric field strength and the unit is MV/cm. The vertical axis is the intensity of polarization and the unit is μC/cm². The polarization strength when the electric field strength is 0 is a residual polarization $P_r$, and the electric field strength when the polarization strength is 0 is a coercive electric field Hereinafter, the hysteresis loops of the ferroelectric thin films are measured by applying a voltage having a frequency of about 1 kHz.

In the hysteresis loop of the ferroelectric thin film manufactured through the first cooling process E1, twice $2P_r$ of the residual polarization $P_r$ value is about 100 μC/cm², and twice $2E_c$ of the coercive electric field $E_c$ value is about 9.5 MV/cm. In the hysteresis loop of the ferroelectric thin film manufactured through the second cooling process E2, twice $2P_r$ of the value of the residual polarization $P_r$ is about 50 μC/cm², and twice $2E_c$ of the value of the coercive electric field $E_c$ is about 8.8 MV/cm. In the hysteresis loop of the ferroelectric thin film manufactured through the third cooling process E3, twice $2P_r$ of the value of the residual polarization $P_r$ is about 20 μC/cm², and twice $2E_c$ of the value of the coercive electric field $E_c$ is about 6.4 MV/cm. That is, the ferroelectric thin film manufactured through the first cooling process E1 may have a larger residual polarization $P_r$ value and a larger coercive electric field $E_c$ value than the ferroelectric thin film manufactured through the second cooling process E2 or the third cooling process E3.

Figure 5A:
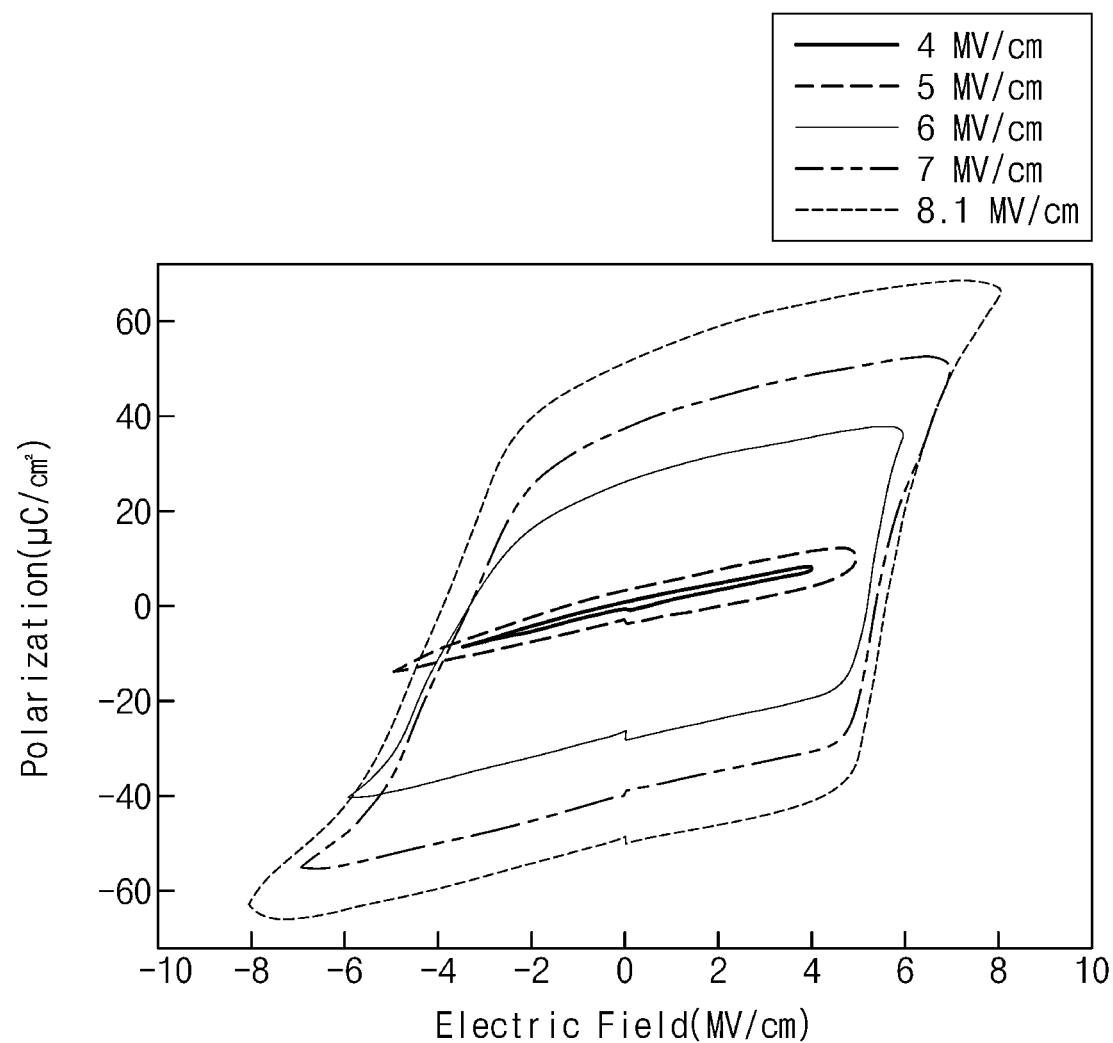
Figure 5B:
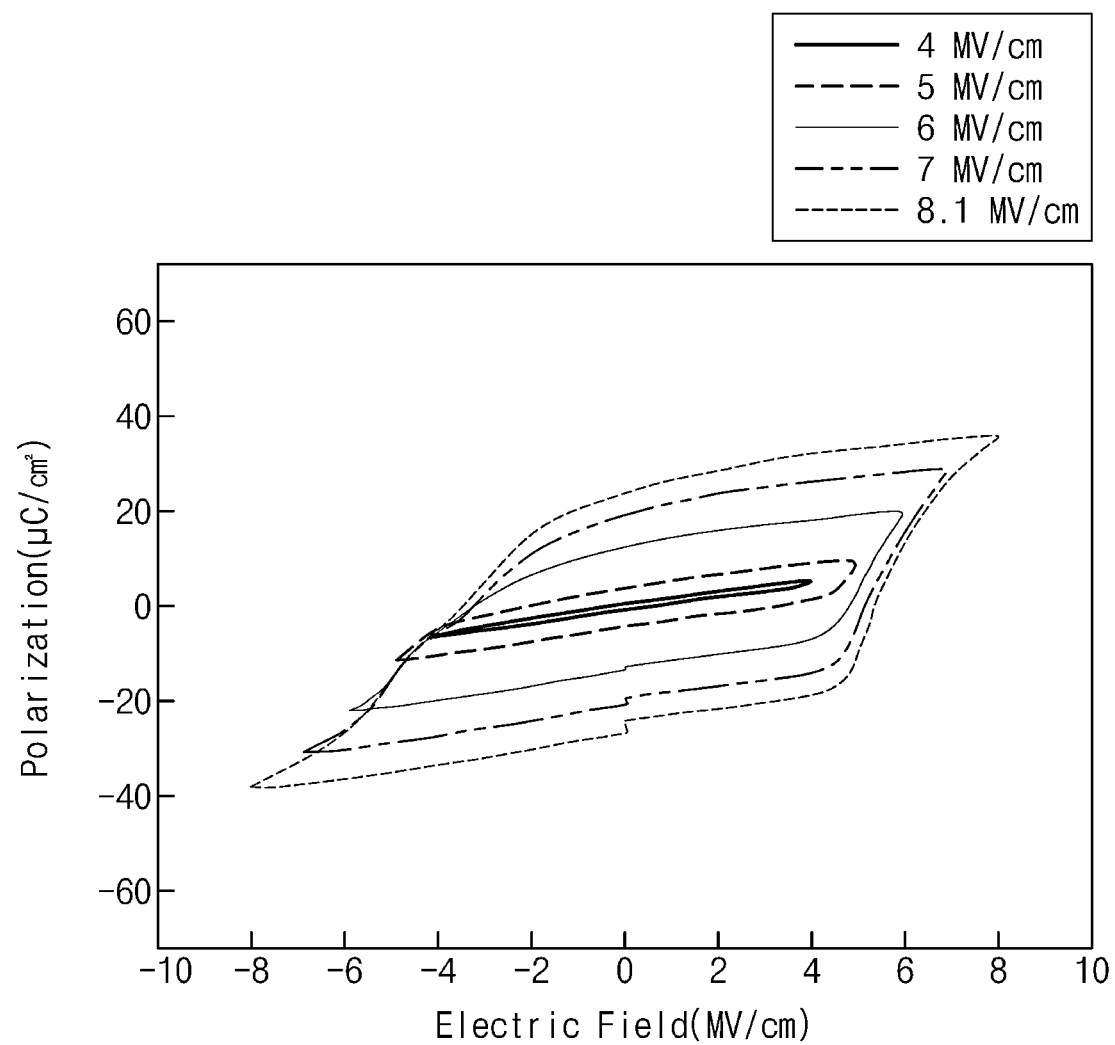

Referring to FIGS. 5A and 5B, hysteresis loops according to an operating electric field of each of the ferroelectric thin films manufactured through the first and second cooling processes E1 and E2 are shown. More specifically, FIGS. 5A and 5B are measured for the case where the operating electric fields are 4 MV/cm, 5 MV/cm, 6 MV/cm, 7 MV/cm, and 8.1 MV/cm, respectively.

All of the ferroelectric thin films manufactured through the first and second cooling processes E1 and E2 may operate when an operating electric field of at least 5 MV/cm or more is applied. When an operating electric field of 5 MV/cm is applied, the value of the coercive electric field $E_c$ of the ferroelectric thin film manufactured through the second cooling process E2 may be greater than the value of the coercive electric field $E_c$ of the ferroelectric thin film manufactured through the first cooling process E1. However, when an operating electric field of 6 MV/cm or more is applied, conversely, the value of the coercive electric field $E_c$ of the ferroelectric thin film manufactured through the first cooling process E1 may be greater than the value of the coercive electric field $E_c$ of the ferroelectric thin film manufactured through the second cooling process E2.

The ferroelectric thin film manufactured through the first cooling process E1 may be used in a multi-bit memory element due to a high residual polarization $P_r$ value and a coercive electric field $E_c$ value.

Figure 6A:
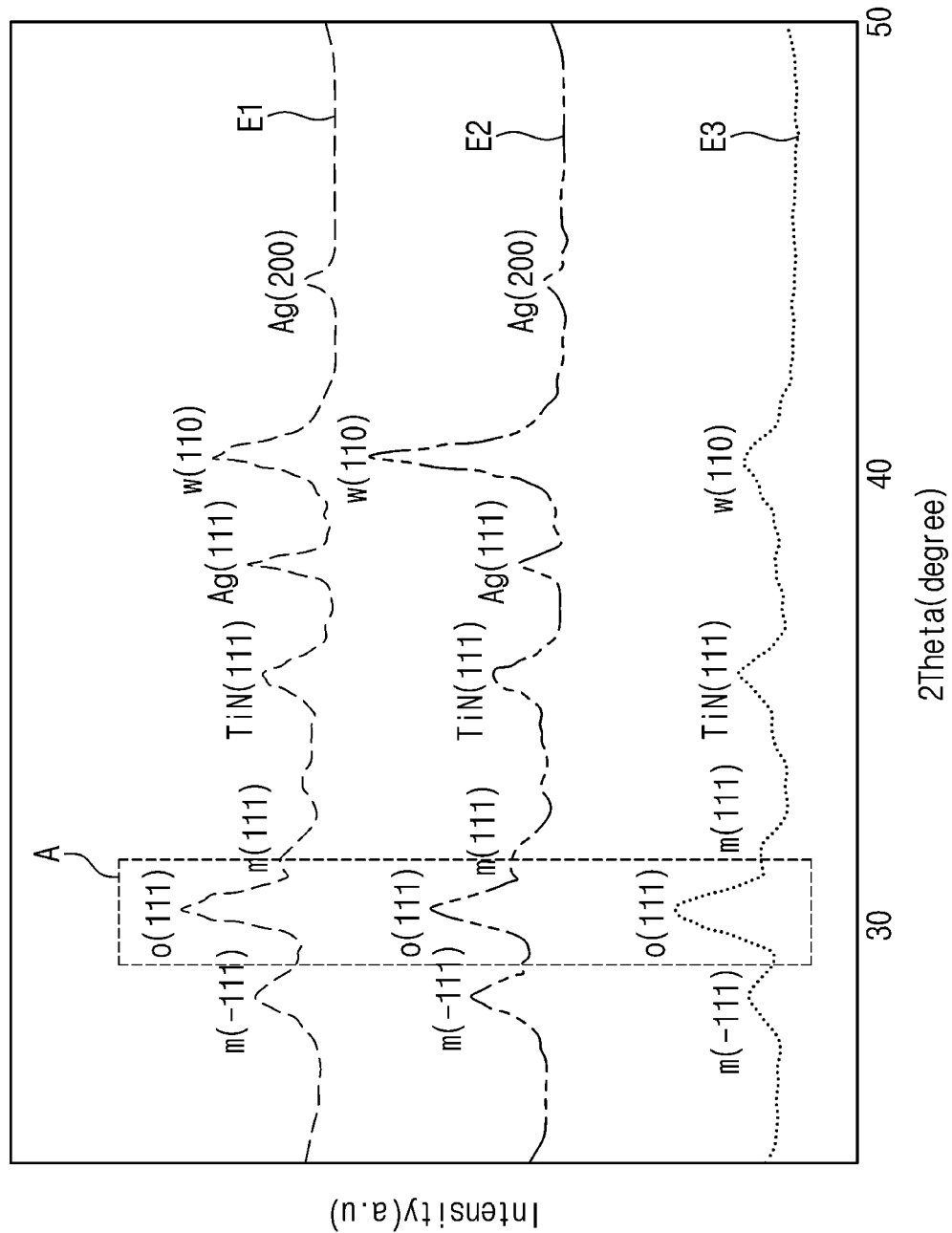
Figure 6B:
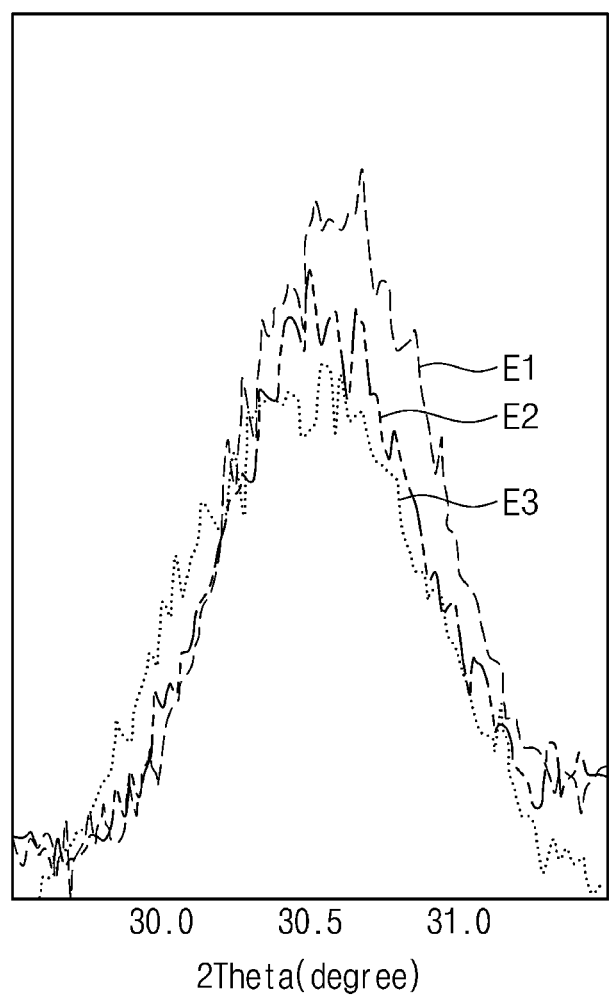

Referring to FIGS. 6A and 6B, grazing incidence X-ray diffraction (GIXRD) analysis patterns of ferroelectric thin films manufactured through the first to third cooling processes E1, E2, and E3 are shown. The horizontal axis is a 2 theta (θ) value, and the unit is degrees. The vertical axis is the peak intensity. FIG. 6B is an enlarged view of part A of FIG. 6A on one graph.

Comparing the GIXRD analysis patterns of the ferroelectric thin films manufactured through the first to third cooling processes E1, E2, and E3, the ferroelectric thin film manufactured through the first cooling process E1 may have a greater intensity of an orthorhombic phase peak o(111) than the ferroelectric thin film manufactured through the second cooling process E2 or the third cooling process E3.

Figure 6C:
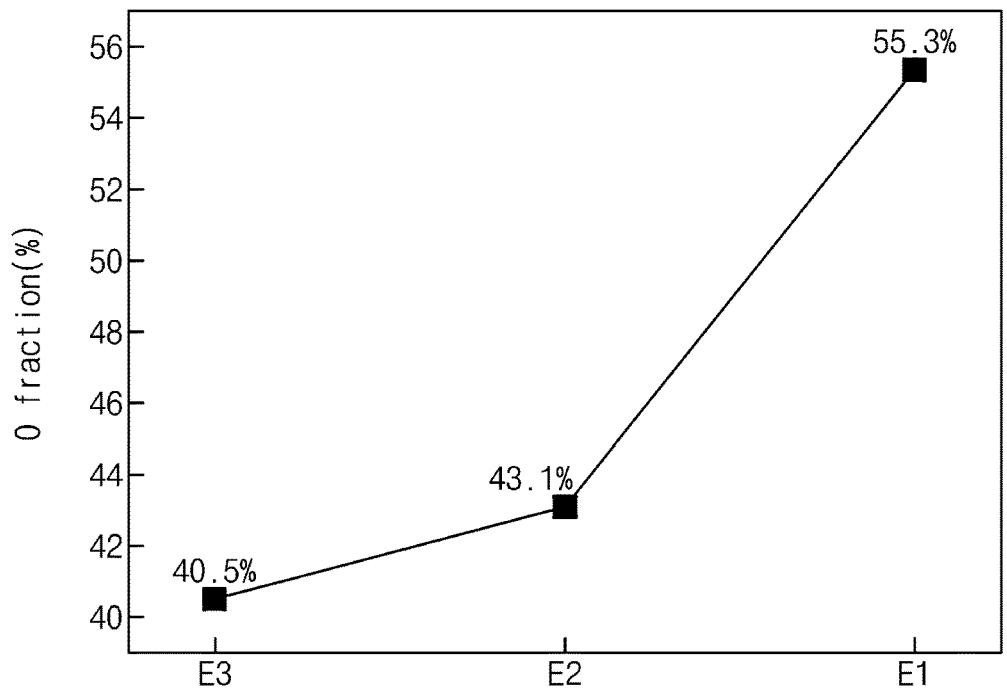

Referring to FIG. 6C, orthorhombic phase fractions of the ferroelectric thin films manufactured through the first to third cooling processes E1, E2, and E3 are illustrated.

More specifically, the orthorhombic phase ratio of the ferroelectric thin film manufactured through the first cooling process E1 is about 55.3%, the orthorhombic phase ratio of the ferroelectric thin film manufactured through the second cooling process E2 is about 43.1%, and the orthorhombic phase ratio of the ferroelectric thin film manufactured through the third cooling process E3 is about 40.5%. That is, the ferroelectric thin film manufactured through the first cooling process E1 may have a higher orthorhombic phase ratio than the ferroelectric thin film manufactured through the second cooling process E2 or the third cooling process E3.

Figure 6D:
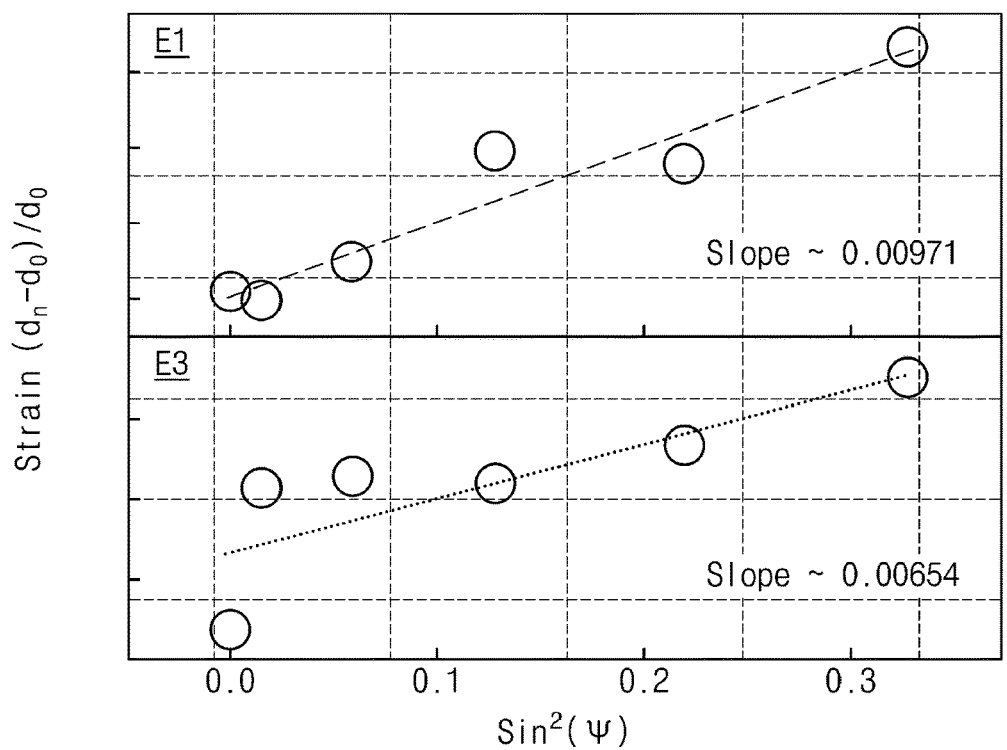

Referring to FIG. 6D, graphs showing residual stresses of the ferroelectric thin films manufactured through the first and third cooling processes E1 and E3 are shown. The horizontal axis is the sin 2ψ value, where ψ is the rotation angle of the sample during GIXRD analysis. The vertical axis is strain, and is expressed as in [Equation 1] below.

$$\varepsilon(strain)=(d_n-d_0)/d_0 \qquad [\text{Equation 1}]$$

In this case, ε is the amount of strain, $d_n$ is the strained inter-planar spacing, and $d_0$ is the unstressed lattice inter-planar spacing in the absence of stress. As shown in FIG. 6D, when the graph showing residual stress is upward sloping, it means that tensile stress is applied. At this time, as the slope of the graph increases, it means a state in which a greater tensile stress is applied.

The slope of the graph showing the residual stress in the ferroelectric thin film manufactured through the first cooling process E1 is about 0.00971, and the slope of the graph representing the residual stress in the ferroelectric thin film manufactured through the third cooling process E3 is about 0.00654. That is, a greater tensile stress may be applied to the ferroelectric thin film manufactured through the first cooling process E1 than the ferroelectric thin film manufactured through the third cooling process E3.

In conclusion, referring to FIGS. 6A to 6D, as the cooling rate is faster tensile stress acting on the ferroelectric thin film may increase, and accordingly, an orthorhombic phase ratio of the ferroelectric thin film may increase.

Figure 7A:
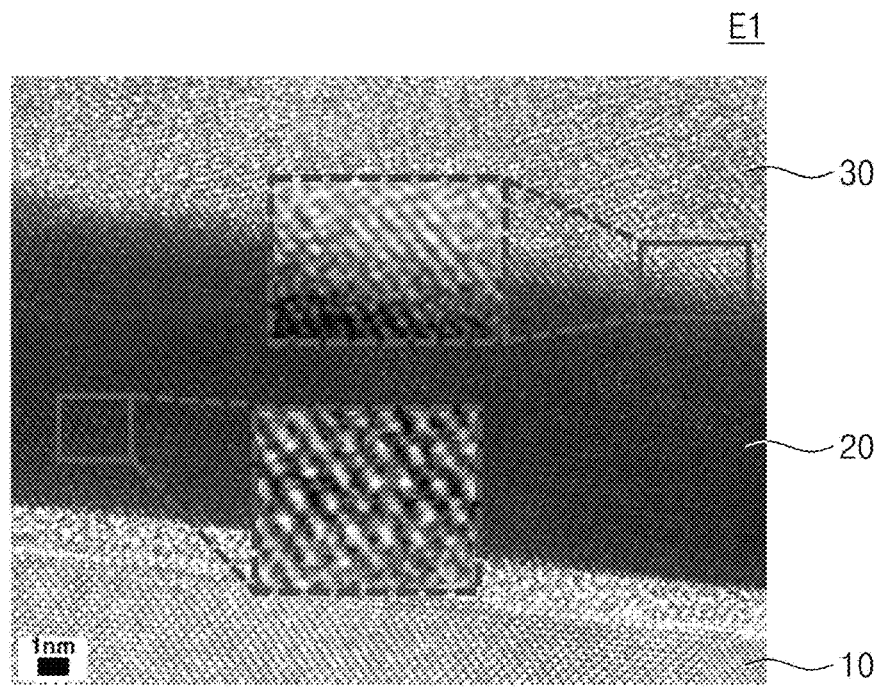
FIGS. 7A to 7C and 8A to 8C are photographs for explaining the comparison between the characteristics of the ferroelectric thin film manufactured through the cooling process according to the embodiment of the inventive concept and the characteristics of the ferroelectric thin film manufactured through the cooling process according to the comparative examples.
Figure 7B:
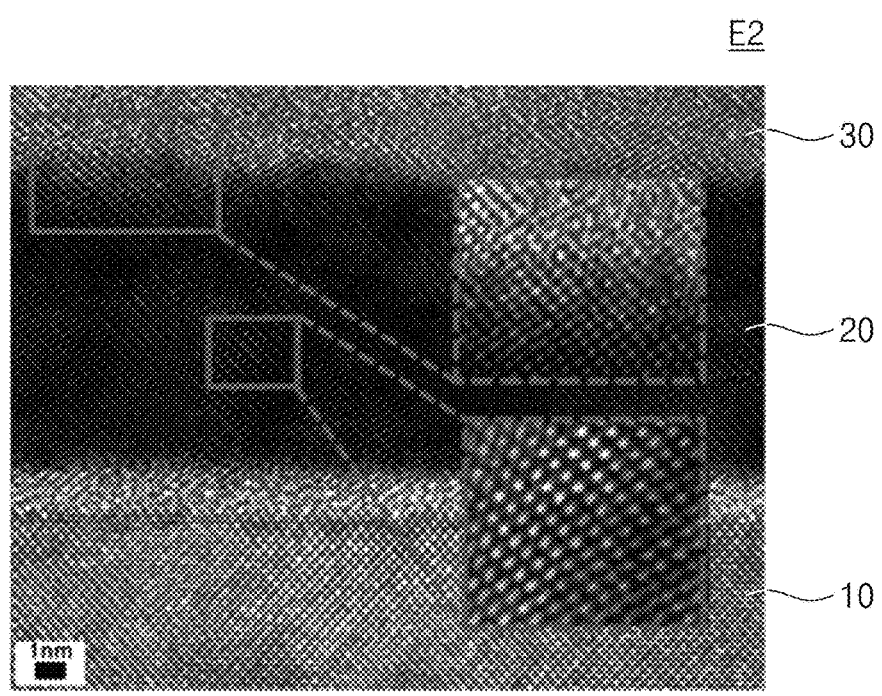
Figure 7C:
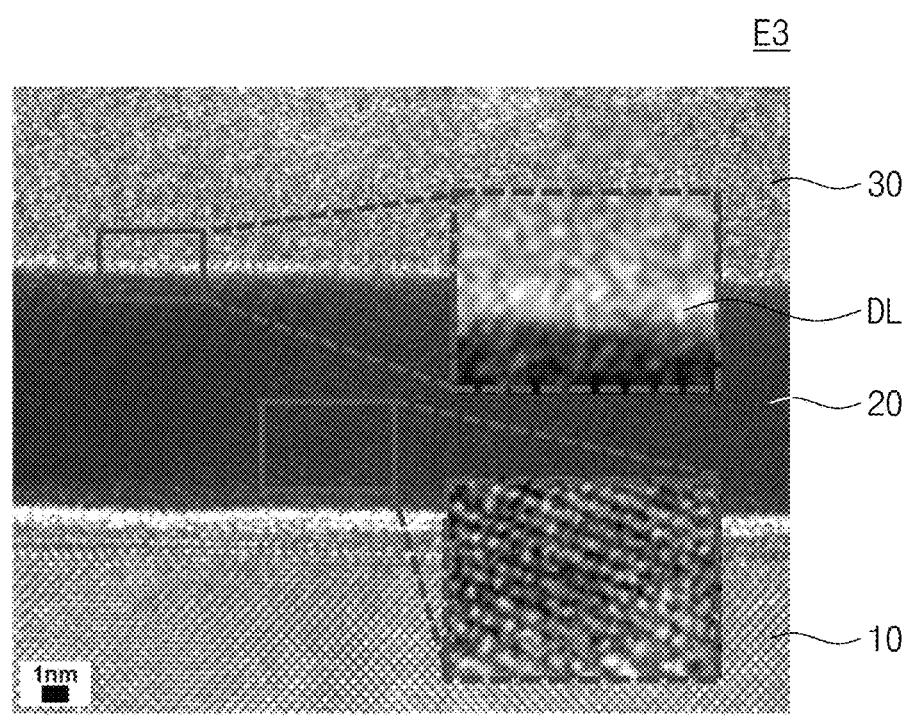
Figure 8A:
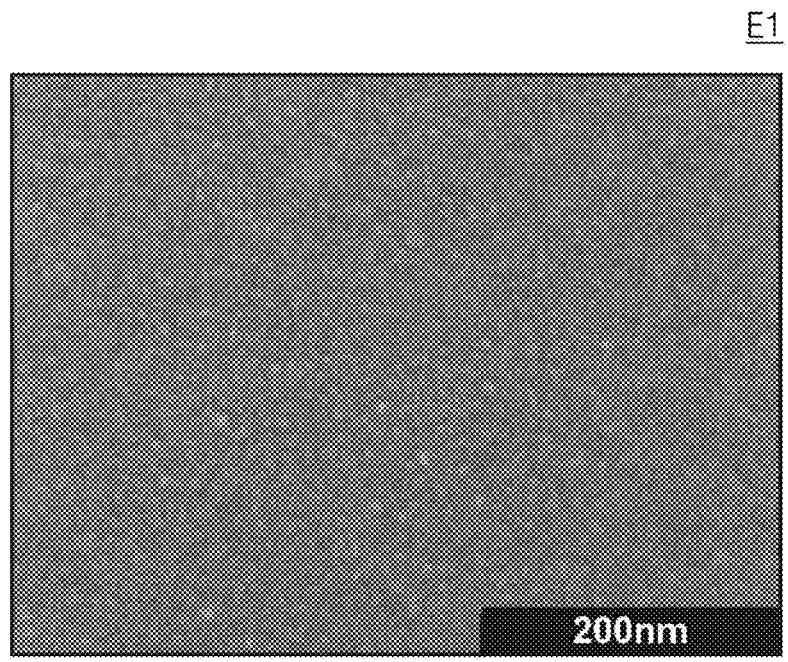
Figure 8B:
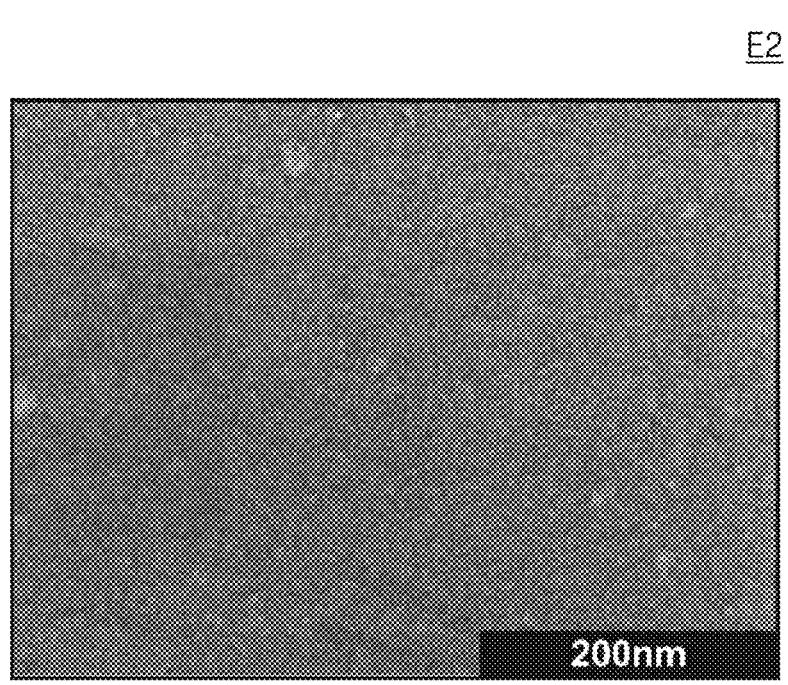
Figure 8C:
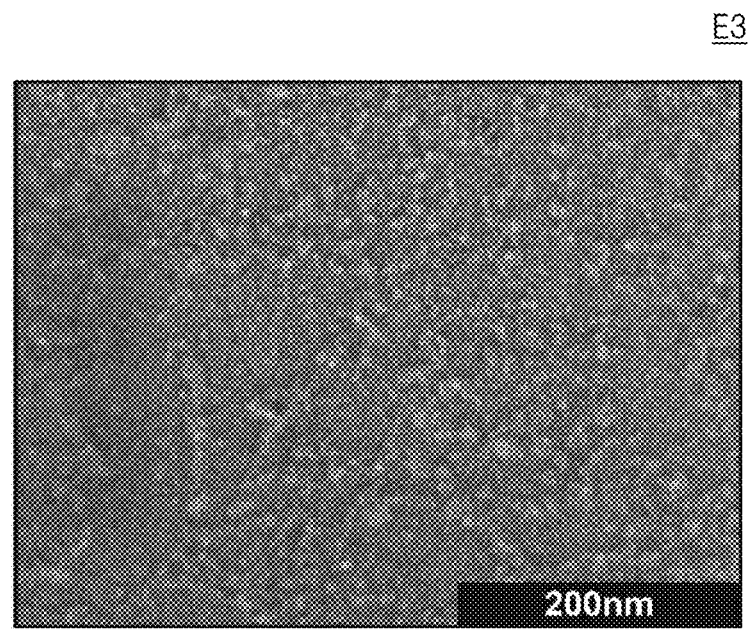
Figure 8D:
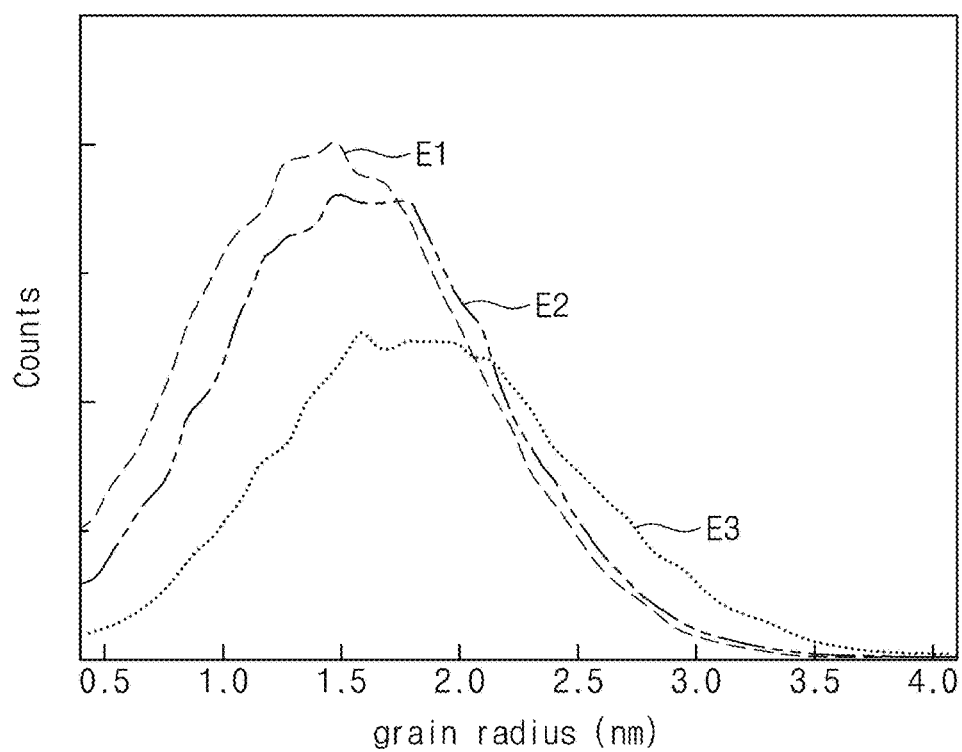

Referring to FIGS. 7A, 7B and 7C together with FIG. 1, high resolution transmission electron microscope (HR-TEM) photographs of the substrate 10, the oxide thin film 20, the first conductive layer 30, and the boundary between the oxide thin film 20 and the first conductive layer 30 are shown. After the third cooling process E3, a diffusion layer DL (refer to FIG. 7C) may be formed at a boundary between the oxide thin film 20 and the first conductive layer 30. The diffusion layer DL may be formed due to diffusion of the material included in the first conductive layer 30 when the cooling rate is relatively slow. In FIG. 7C, the diffusion layer DL may be formed with a thickness of about 0.6 nm to 0.7 nm.

After the first cooling process E1 and the second cooling process E2, the diffusion layer DL formed at the boundary between the oxide thin film 20 and the first conductive layer 30 may be about 0.5 nm or less, more preferably, about 0.1 nm or less.

Referring to FIGS. 8A, 8B, 8C and 8D, SEM photographs (refer to FIGS. 8A to 8C) of the surfaces of the ferroelectric thin films manufactured through the first to third cooling processes E1, E2, and E3 and a graph (refer to FIG. 8D) showing the grain size of the ferroelectric thin films manufactured through the first to third cooling processes E1, E2, and E3 are shown.

The grain size of the ferroelectric thin films manufactured through the first to third cooling processes E1, E2, and E3 may be measured as a grain radius. The average grain radius of the ferroelectric thin film manufactured through the first cooling process E1 is about 3 nm, the average grain radius of the ferroelectric thin film manufactured through the second cooling process E2 is about 3.2 nm, and the average grain radius of the ferroelectric thin film manufactured through the third cooling process E3 is about 3.7 nm. That is, the ferroelectric thin film manufactured through the first cooling process E1 may have a smaller average grain radius than the ferroelectric thin film manufactured through the second cooling process E2 or the third cooling process E3.

Figure 9A:
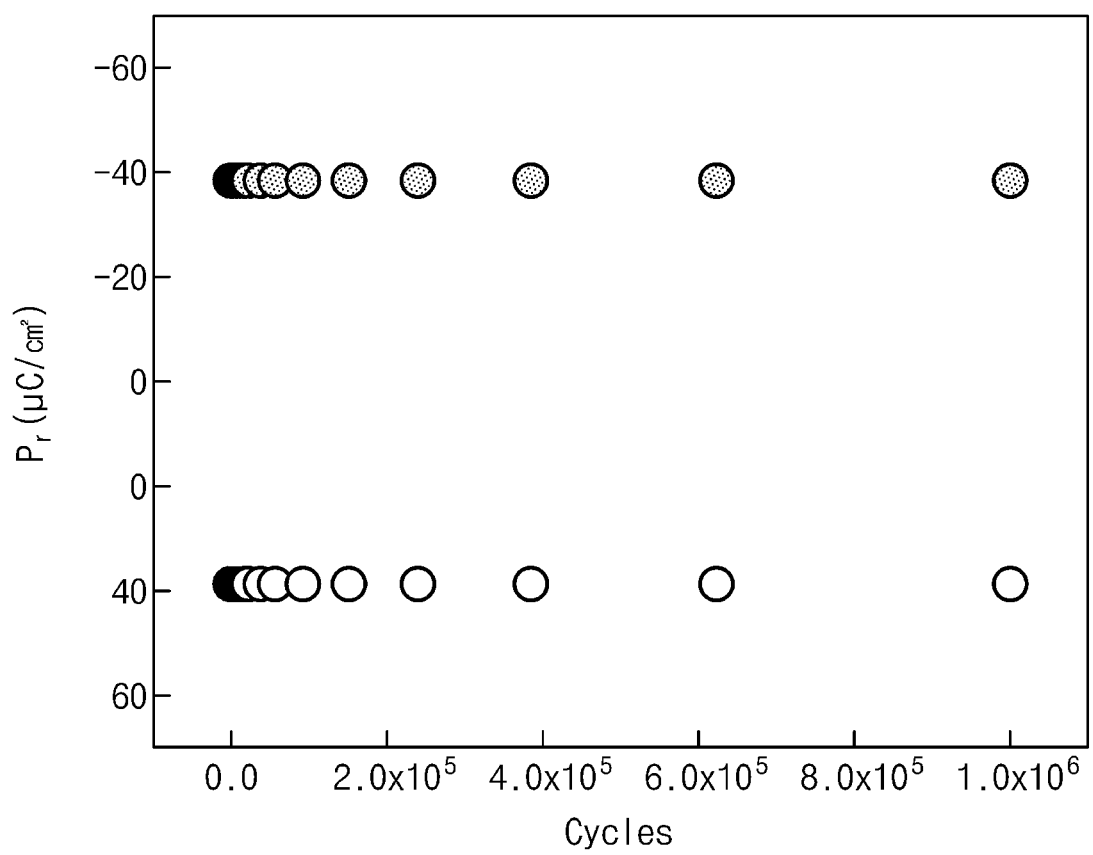
FIGS. 9A and 9B are graphs for explaining the characteristics of a ferroelectric thin film manufactured through a cooling process according to an embodiment of the inventive concept.
Figure 9B:
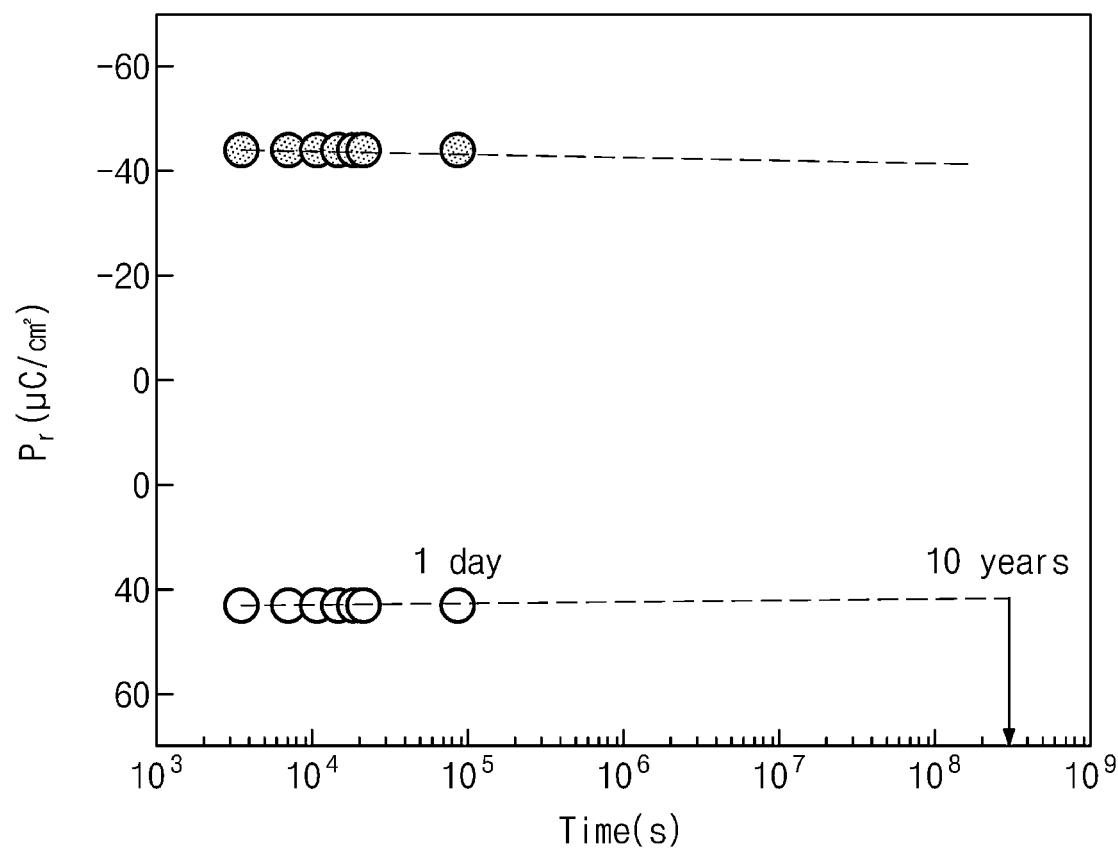

FIGS. 9A and 9B are graphs for explaining the characteristics of a ferroelectric thin film manufactured through a cooling process according to an embodiment of the inventive concept.

Referring to FIGS. 9A and 9B, reliability measurement results of an element including a ferroelectric thin film manufactured through a cooling process (i.e., the first cooling process E1) according to an embodiment of the inventive concept are shown. The element including the ferroelectric thin film may be, for example, a capacitor element using the first and second conductive layers 30 and 40 of FIG. 1 as upper electrodes.

Referring to FIG. 9A, an element including a ferroelectric thin film may maintain a residual polarization $P_r$ value for 106 cycles. Also, referring to FIG. 9B, the element including the ferroelectric thin film may maintain the residual polarization $P_r$ value for about 24 hours (i.e., 1 day) or more. In conclusion, when the ferroelectric thin film manufactured through the cooling process (i.e., the first cooling process E1) according to the embodiment of the inventive concept is used, the endurance and reliability of the element may be improved.

Figure 10:
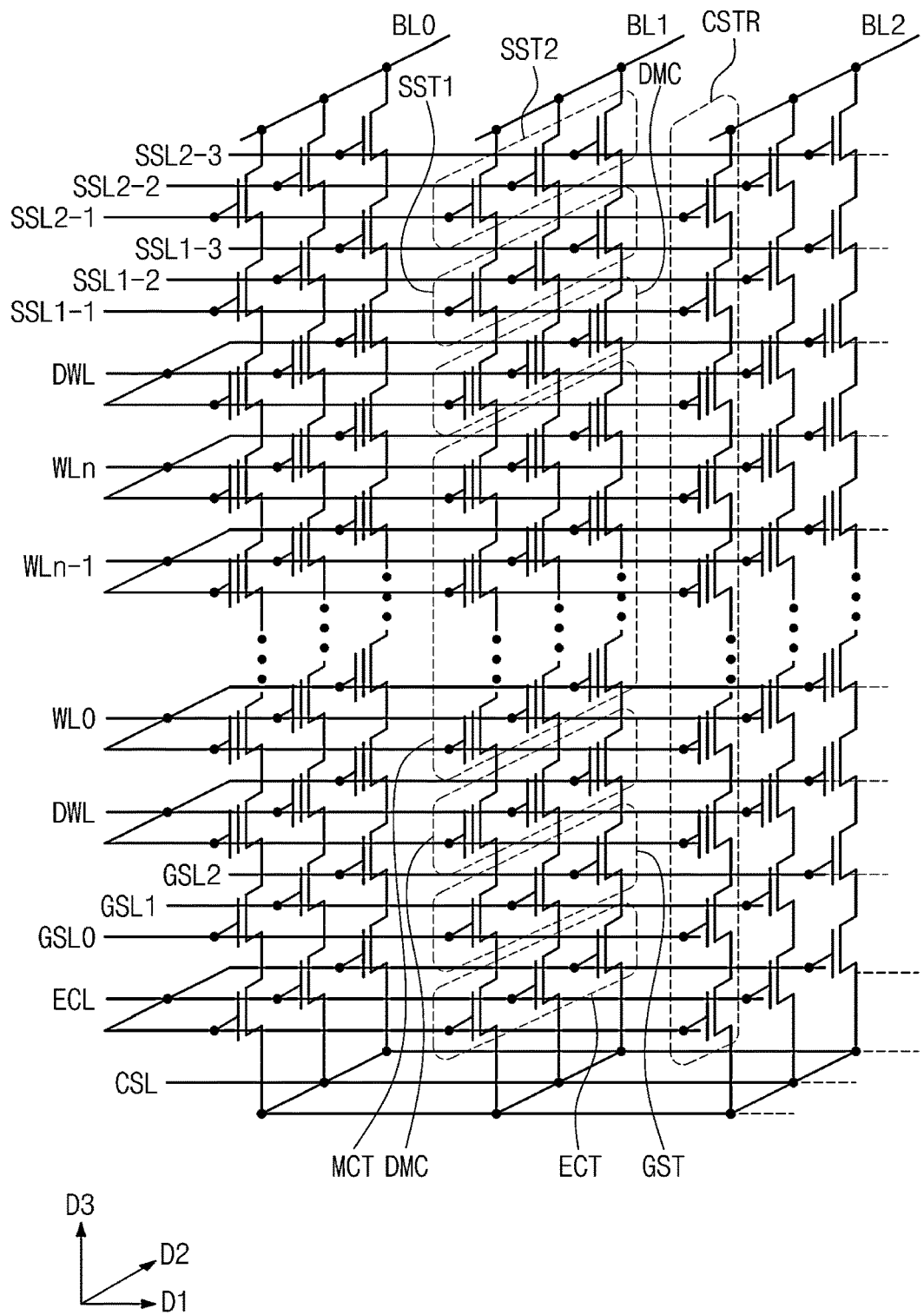
FIG. 10 is a simplified circuit diagram for explaining a three-dimensional semiconductor memory device including a ferroelectric thin film manufactured through a method of manufacturing a ferroelectric thin film according to an embodiment of the inventive concept.

FIG. 10 is a simplified circuit diagram for explaining a three-dimensional semiconductor memory device including a ferroelectric thin film manufactured through a method of manufacturing a ferroelectric thin film according to an embodiment of the inventive concept.

Referring to FIG. 10, the cell array of the three-dimensional semiconductor memory device according to the inventive concept may include a common source line CSL, a plurality of bit lines BL0, BL1, BL2, and a plurality of cell strings CSTR provided between the common source line CSL and the bit lines BL0, BL1, and BL2.

The cell strings CSTR may be two-dimensionally arranged along the first direction D1 and the second direction D2 intersecting the first direction D1. For example, the second direction D2 may be a direction orthogonal to the first direction D1. Each of the cell strings CSTR may extend in the third direction D3. For example, the third direction D3 may be a direction perpendicular to the first direction D1 and the second direction D2. The bit lines BL0, BL1, and BL2 may be spaced apart from each other in the first direction D1. The bit lines BL0, BL1, and BL2 may each extend in the second direction D2.

A plurality of cell strings CSTR may be connected in parallel to each of the bit lines BL0, BL1, and BL2. The plurality of cell strings CSTR may be commonly connected to the common source line CSL. The plurality of cell strings CSTR may be provided between the plurality of bit lines BL0, BL1, and BL2 and one common source line CSL. The plurality of common source lines CSL may be provided. The plurality of common source lines CSL may be two-dimensionally arranged. The same voltage may be applied to the common source lines CSL, or each of the common source lines CSL may be electrically controlled.

According to embodiments, each of the cell strings CSTR may include first and second string select transistors SST1 and SST2 connected in series, memory cell transistors MCT connected in series, a ground select transistor GST, and an erase control transistor ECT. In addition, each of the memory cell transistors MCT may include a data storage element.

For example, each of the cell strings CSTR may include first and second string select transistors SST1 and SST2 connected in series, and the second string select transistor SST2 may be connected to one of the bit lines BL0, BL1, and BL2. Unlike this, each of the cell strings CSTR may include one string select transistor. As another example, similar to the first and second string select transistors SST1 and SST2, the ground select transistor GST in each of the cell strings CSTR may include a plurality of MOS transistors connected in series.

One cell string CSTR may include a plurality of memory cell transistors MCT having different distances from the common source lines CSL. The memory cell transistors MCT may be connected in series between the first string select transistor SST1 and the ground select transistor GST. The erase control transistor ECT may be connected between the ground select transistor GST and the common source lines CSL. Each of the cell strings CSTR may further include dummy cell transistors DMC that are respectively connected between the first string select transistor SST1 and an uppermost one of the memory cell transistors MCT, and between the ground select transistor GST and the lowest one of the memory cell transistors MCT.

According to embodiments, the first string select transistor SST1 may be controlled by the first string select lines SSL1-1, SSL1-2, SSL1-3, and the second string select transistor SST2 may be controlled by the second string select lines SSL2-1, SSL2-2, and SSL2-3. Each of the memory cell transistors MCT may be controlled by a plurality of word lines WL0 to WLn, and each of the dummy cell transistors DMC may be controlled by a dummy word line DWL. The ground select transistor GST may be controlled by the ground select lines GSL0, GSL1, and GSL2, and the erase control transistor ECT may be controlled by the erase control line ECL. A plurality of erase control transistors ECT may be provided. The common source lines CSL may be commonly connected to sources of the erase control transistors ECT.

Gate electrodes of the memory cell transistors MCT, which are provided at substantially the same distance from the common source lines CSL, are commonly connected to one of the word lines WL0-WLn and DWL to be in an equipotential state. Alternatively, even if the gate electrodes of the memory cell transistors MCT are provided at substantially the same level from the common source lines CSL, gate electrodes provided in different rows or columns may be independently controlled.

Ground selection lines GSL0, GSL1, GSL2, first string selection lines SSL1-1, SSL1-2, SSL1-3, and second string selection lines SSL2-1, SSL2-2, SSL2-3) may extend along the first direction D1 and may be spaced apart from each other in the second direction D2. The ground selection lines GSL0, GSL1, and GSL2, the first string selection lines SSL1-1, SSL1-2, and SSL1-3, and the second string selection lines SSL2-1, SSL2-2, and SSL2-3, which are provided at substantially the same level from the common source lines CSL, may be electrically isolated from each other. Also, the erase control transistors ECT of different cell strings CSTR may be controlled by the common erase control line ECL. The erase control transistors ECT may generate a gate induced drain leakage (GIDL) during an erase operation of the memory cell array. In some embodiments, during an erase operation of the memory cell array, an erase voltage may be applied to the bit lines BL0, BL1, BL2 and/or the common source lines CSL, and a gate induced leakage current may be generated in the string select transistor SST and/or the erase control transistors ECT.

Figure 11:
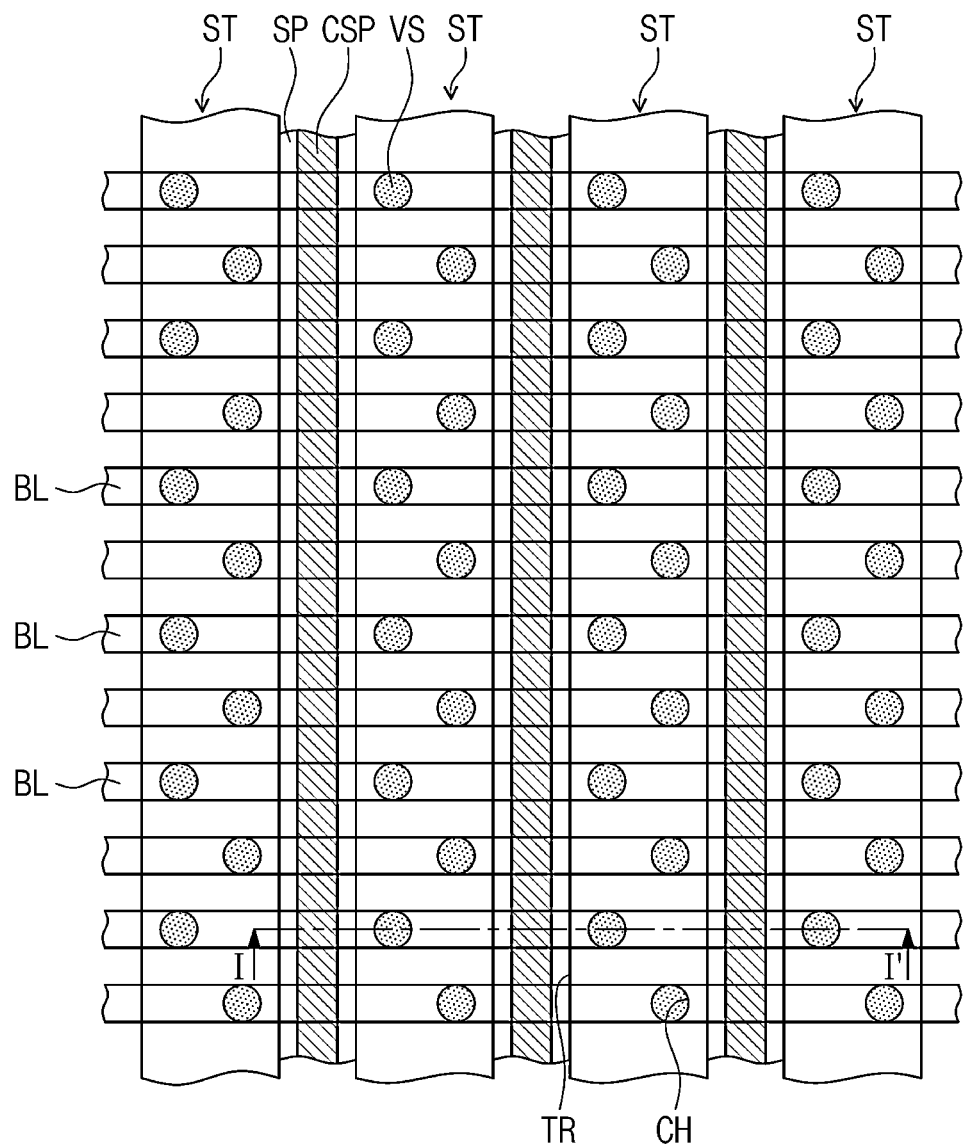
FIG. 11 is a plan view illustrating a three-dimensional semiconductor memory device including a ferroelectric thin film manufactured through a method of manufacturing a ferroelectric thin film according to an embodiment of the inventive concept.
Figure 12:
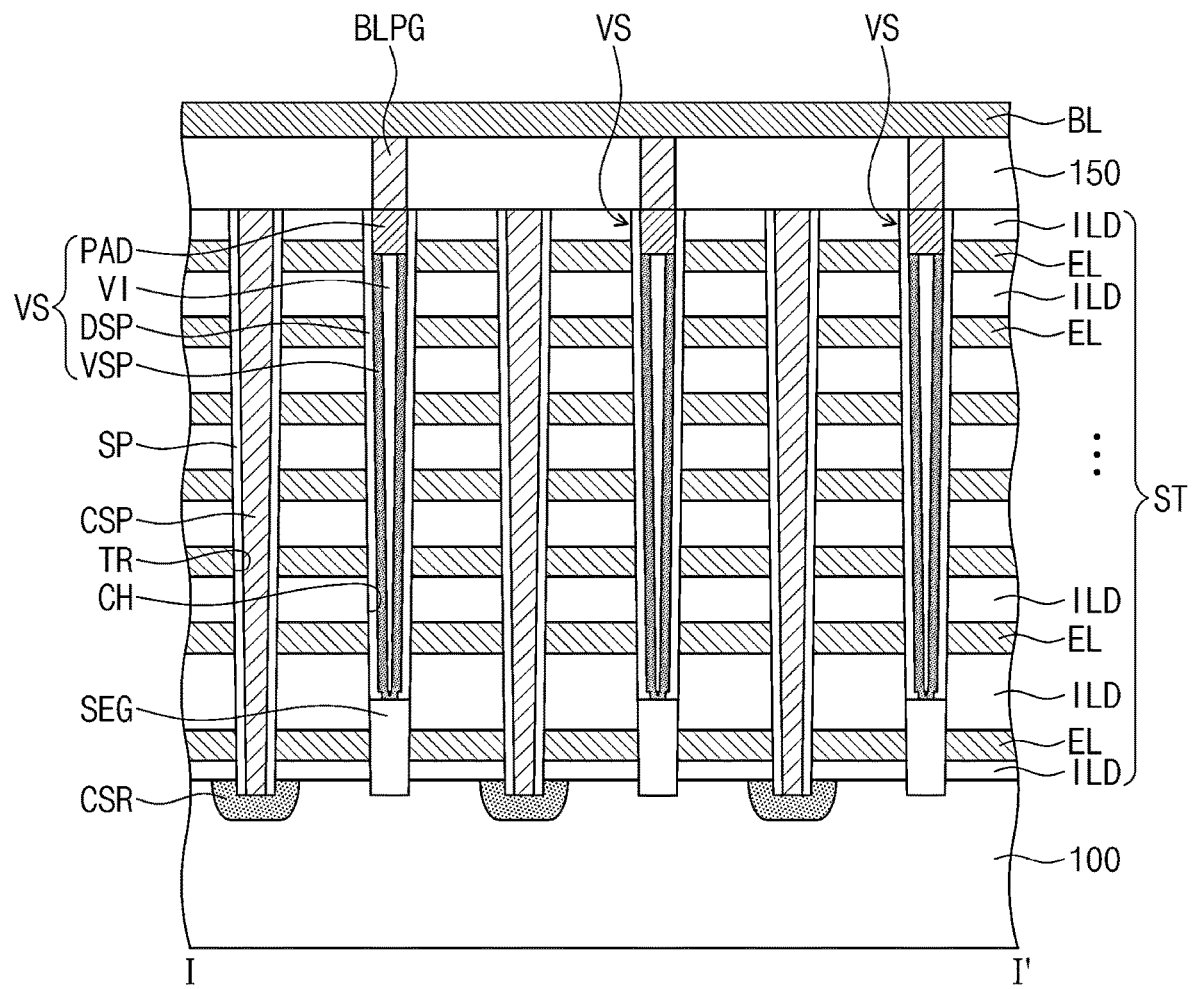
FIG. 12 is a cross-sectional view illustrating a three-dimensional semiconductor memory device including a ferroelectric thin film manufactured through a method of manufacturing a ferroelectric thin film according to an embodiment of the inventive concept and corresponds to a cross-section taken along line I-I' in FIG. 11.

FIG. 11 is a plan view illustrating a three-dimensional semiconductor memory device including a ferroelectric thin film manufactured through a method of manufacturing a ferroelectric thin film according to an embodiment of the inventive concept. FIG. 12 is a cross-sectional view illustrating a three-dimensional semiconductor memory device including a ferroelectric thin film manufactured through a method of manufacturing a ferroelectric thin film according to an embodiment of the inventive concept and corresponds to a cross-section taken along line I-I' in FIG. 11.

Referring to FIGS. 11 and 12, a plurality of stack structures ST may be disposed on the substrate 100. Each of the stack structures ST may extend side by side in the first direction D1. The stack structures ST may be arranged along the second direction D2 and may be spaced apart from each other in the second direction D2. The substrate 100 may be a semiconductor substrate doped with impurities. The substrate 100 may be a semiconductor substrate doped with impurities of a first conductivity type (e.g., P-type). The substrate 100 may be, for example, a single crystal epitaxial layer grown on a silicon substrate, a silicon-germanium substrate, a germanium substrate, or a monocrystalline silicon substrate.

Each of the stack structures ST may include gate electrodes EL and interlayer dielectric layers ILD that are alternately stacked in a third direction D3 perpendicular to the upper surface of the substrate 100. The stack structures ST may have a substantially flat upper surface. The upper surfaces of the stack structures ST may be parallel to the upper surface of the substrate 100.

Referring to FIG. 10 again, each of the gate electrodes EL may be one of the erase control line ECL, the ground selection lines GSL0, GSL1, and GSL2, the word lines WL0 to WLn and DWL, the first string selection lines SSL1-1, SSL1-2, and SSL1-3 and the second string selection lines SSL2-1, SSL2-2, and SSL2-3, which are sequentially stacked on the substrate 100. Each of the gate electrodes EL may have substantially the same thickness in the third direction D3. Hereinafter, the thickness means a thickness in the third direction D3. The gate electrodes EL may include, for example, at least one selected from a doped semiconductor (e.g., doped silicon, etc.), a metal (e.g., W, Cu, Al, etc.), a conductive metal nitride (e.g., TiN, TaN, etc.) or a transition metal (e.g., Ti, Ta, etc.).

Although not shown in the drawing, an end of each of the stack structures ST may have a stepwise structure along the first direction D1. More specifically, the length of the gate electrodes EL of the stack structures ST in the first direction D1 may decrease as the distance from the substrate 100 increases. The topmost one of the gate electrodes EL may have the smallest length in the first direction D1 and the largest distance from the substrate 100 in the third direction D3. The bottommost one of the gate electrodes EL may have the largest length in the first direction D1 and the smallest distance from the substrate 100 in the third direction D3. By a stepwise structure, each of the stack structures ST may have a thickness that decreases as the distance from the outer-most one of the vertical channel structures VS to be described later increases, and sidewalls of the gate electrodes EL may be spaced apart from each other at regular intervals along the first direction D1 from a flat point of view.

Each of the interlayer dielectric layers ILD may have a different thickness. For example, a bottommost one and a topmost one of the interlayer dielectric layers ILD may have a smaller thickness than other interlayer dielectric layers ILD. However, this is merely exemplary, and the inventive concept is not limited thereto, and each of the interlayer dielectric layers ILD may have a different thickness, and the thickness of each of the interlayer dielectric layers ILD may vary according to characteristics of the semiconductor device. The interlayer dielectric layers ILD may include, for example, silicon oxide.

A plurality of channel holes CH penetrating a portion of the stack structures ST and the substrate 100 may be provided. Lower epitaxial layers SEG and vertical channel structures VS may be provided inside the channel holes CH. Each of the lower epitaxial layers SEG may fill a lower portion of each of the channel holes CH, and may be connected to each of the vertical channel structures VS at an upper portion thereof. A portion of each of the lower epitaxial layers SEG may be buried in the substrate 100, and lower surfaces of the lower epitaxial layers SEG may be positioned at a level lower than that of the upper surface of the substrate 100. The vertical channel structures VS may be connected to the substrate 100 through the lower epitaxial layers SEG. However, this is only an example, and the structure of the three-dimensional semiconductor memory device according to the inventive concept is not limited to the illustrated one, and unlike the drawings, the lower epitaxial layers SEG may not be provided and the vertical channel structures VS may be directly connected to the substrate 100. Also, unlike shown in the drawings, each of the channel holes CH may have a step difference at one or more boundaries.

A plurality of columns of the vertical channel structures VS penetrating any one of the stack structures ST may be provided. For example, as shown in FIG. 11, columns of two vertical channel structures VS may penetrate one of the stack structures ST. However, the inventive concept is not limited thereto, and columns of three or more vertical channel structures VS may penetrate one of the stack structures ST. In a pair of adjacent columns, vertical channel structures VS corresponding to one column may be shifted in the first direction D1 from vertical channel structures VS corresponding to another adjacent column. From a flat point of view, the vertical channel structures VS may be arranged in a zigzag shape along the first direction D1.

Each of the vertical channel structures VS may have a cylindrical shape having a long axis extending from the substrate 100 in the third direction D3. Each of the vertical channel structures VS, for example, may increase in width in the first direction D1 and the second direction D2 as it goes toward the third direction D3. An upper surface of each of the vertical channel structures VS may have a circular shape, an oval shape, or a bar shape.

Each of the vertical channel structures VS may include a data storage pattern DSP conformally covering an inner sidewall of each of the channel holes CH, a vertical semiconductor pattern VSP covering an inner sidewall of the data storage pattern DSP, a buried insulating pattern VI surrounded by the vertical semiconductor pattern DSP, and a conductive pad PAD on the buried insulating pattern VI. In each of the vertical channel structures VS, the data storage pattern DSP may have a pipe shape or macaroni shape whose bottom end is opened, and the vertical semiconductor pattern VSP may have a pipe shape or a macaroni shape whose bottom end is closed. The buried insulating pattern VI may fill a space surrounded by the vertical semiconductor pattern VSP and the conductive pad PAD.

The data storage pattern DSP may contact sidewalls of the gate electrodes EL and sidewalls of the interlayer dielectric layers ILD. The data storage pattern DSP may have a single-layer structure including a ferroelectric material. The data storage pattern DSP may include the same material as the oxide thin film 20 described with reference to FIGS. 1 and 2. The data storage pattern DSP may include, for example, at least one of $HfO_x$, PZT ($Pb(Zr, Ti)O_3$), PTO ($PbTiO_3$), SBT ($SrBi_2Ti_2O_9$), BLT ($Bi(La, Ti)O_3$), PLZT ($Pb(La, Zr)TiO_3$), BST ($Bi(Sr, Ti)O_3$), barium titanate ($BaTiO_3$), P(VDF-TrFE), PVDF, $AlO_x$, $ZnO_x$, $TiO_x$, $TaO_x$, or $InO_x$, doped with at least one impurity of Al, Gd, Si, Y, Zr, Sr, Sc, Ge, Ce, Ca, La, Sn, Dy, or Er having an orthorhombic crystal structure. The data storage pattern DSP may represent a binary data value as a voltage change due to a polarization phenomenon.

The vertical semiconductor pattern VSP in direct contact with the data storage pattern DSP may include a material having a thermal expansion coefficient different from that of the data storage pattern DSP.

The vertical semiconductor pattern VSP may include, for example, an oxide semiconductor material capable of blocking, suppressing, or minimizing leakage current. The vertical semiconductor pattern VSP may include an oxide semiconductor material including at least one of In, Zn, and Ga or a Group 4 semiconductor material having excellent leakage current characteristics. The vertical semiconductor pattern VSP may include, for example, a $ZnO_x$-based material including AZO, ZTO, IZO, ITO, IGZO, or Ag—ZnO. In this case, the vertical semiconductor pattern VSP may block, suppress or minimize leakage current to the gate electrodes EL or the substrate 100, and improve transistor characteristics (e.g., threshold voltage distribution and speed of a program/read operation) of at least one of the gate electrodes EL. Accordingly, the electrical characteristics of the three-dimensional semiconductor memory device according to the inventive concept may be improved.

As another example, the vertical semiconductor pattern VSP may include a silicon-based material capable of diffusing carriers. The vertical semiconductor pattern VSP may include, for example, a semiconductor material doped with an impurity, an intrinsic semiconductor material in an undoped state, or a polycrystalline semiconductor material. For example, the vertical semiconductor pattern VSP may include polysilicon doped with impurities of the same first conductivity type (e.g., P-type) as the substrate 100. In this case, the vertical semiconductor pattern VSP may have excellent hole mobility, and thus may help hole injection and diffusion by GIDL in at least one of the gate electrodes EL. That is, the vertical semiconductor pattern VSP may enable a hole injection-based memory operation, and thus the electrical characteristics of the three-dimensional semiconductor memory device according to the inventive concept may be improved.

Referring to FIG. 10 again, the vertical channel structures VS may correspond to channels of the erase control transistor ECT, the first and second string select transistors SST1 and SST2, the ground select transistor GST, and the memory cell transistors MCT.

A conductive pad PAD may be provided on the upper surface of the buried insulating pattern VI and on the upper surface of the vertical semiconductor pattern VSP. The conductive pad PAD may be connected to an upper portion of the vertical semiconductor pattern VSP. A sidewall of the conductive pad PAD may be surrounded by, for example, a data storage pattern DSP. A top surface of the conductive pad PAD may be substantially coplanar with an upper surface of each of the stack structures ST (i.e., upper surface of the topmost one of the interlayer dielectric layers ILD). The lower surface of the conductive pad PAD may be positioned, for example, at a level lower than that of the upper surface of the topmost one of the gate electrodes EL. More specifically, the lower surface of the conductive pad PAD may be positioned between the upper surface and the lower surface of the topmost one of the gate electrodes EL. That is, at least a portion of the conductive pad PAD may horizontally overlap the topmost one of the gate electrodes EL.

The conductive pad PAD may include a semiconductor doped with impurities or a conductive material. The conductive pad PAD may include, for example, a semiconductor material doped with impurities of a second conductivity type (e.g., N-type) different from a first conductivity type (e.g., P-type). The conductive pad PAD may reduce contact resistance between the bit line BL and the vertical semiconductor pattern VSP, which will be described later. The conductive pad PAD may supply carriers to the vertical semiconductor pattern VSP.

An isolation trench TR extending in the first direction D1 may be provided between the stack structures ST adjacent to each other. The common source region CSR may be provided inside the substrate 100 exposed by the isolation trench TR. The common source area CSR may extend in the first direction D1 within the substrate 100. The common source area CSR may include a semiconductor material doped with impurities of a second conductivity type (e.g., N-type) different from the first conductivity type. The common source area CSR may correspond to the common source line CSL of FIG. 10.

A common source plug CSP may be provided in the isolation trench TR. The common source plug CSP may be connected to the common source area CSR. The common source plug CSP may have a flat plate shape extending in the first direction D1 and the third direction D3. The common source plug CSP may, for example, increase in width in the second direction D2 as it goes toward the third direction D3.

Insulating spacers SP may be interposed between the common source plug CSP and the stack structures ST. The insulating spacers SP may be provided to face each other between the stack structures ST adjacent to each other. The insulating spacers SP may include, for example, silicon oxide, silicon nitride, silicon oxynitride, or a low-k material having a low dielectric constant.

A capping insulating film 150 may be provided on the stack structures ST, the vertical channel structures VS, and the common source plug CSP. The capping insulating film 150 may cover the upper surface of the topmost one of the interlayer dielectric layers ILD, the upper surface of the conductive pad PAD, and the upper surface of the common source plug CSP. The capping insulating film 150 may include, for example, an insulating material different from that of the interlayer dielectric layers ILD. A bit line contact plug BPLG electrically connected to the conductive pad PAD may be provided inside the capping insulating film 150. The bit line contact plug BPLG may increase in width in the first direction D1 and the second direction D2 as it goes toward the third direction D3, for example.

A bit line BL may be provided on the capping insulating film 150 and the bit line contact plug BPLG. The bit line BL may extend in the second direction D2. The bit line BL may be electrically connected to the vertical channel structures VS through the bit line contact plug BPLG. The bit line BL and the bit line contact plug BPLG may include a conductive material. The bit line BL may correspond to any one of the plurality of bit lines BL0, BL1, and BL2 of FIG. 10.

FIGS. 13 to 18 are cross-sectional views of a three-dimensional semiconductor memory device according to an embodiment of the inventive concept, and each corresponds to cross-section taken along line I-I' of FIG. 11.

A method of manufacturing a three-dimensional semiconductor memory device according to the inventive concept may include forming a mold structure including interlayer dielectric layers and sacrificial layers alternately stacked on a substrate; forming channel holes penetrating the mold structure, forming vertical channel structures inside the channel holes, forming an isolation trench penetrating the mold structure and having a line shape extending in one direction, selectively removing the sacrificial layers exposed by the isolation trench, forming gate electrodes filling the space from which the sacrificial layers are removed, forming a common source area in the substrate exposed by the isolation trench, and forming an insulating spacer covering a sidewall of the isolation trench and a common source plug filling an internal space of the isolation trench surrounded by the insulating spacer. In particular, the method of manufacturing a 3D semiconductor memory device according to the inventive concept may further include performing a heat treatment process and a cooling process on the vertical channel structures after forming the gate electrodes. Hereinafter, each step of the method of manufacturing a 3D semiconductor memory device according to an embodiment of the inventive concept will be described in detail with reference to FIGS. 13 to 18, 11 and 12.

Figure 13:
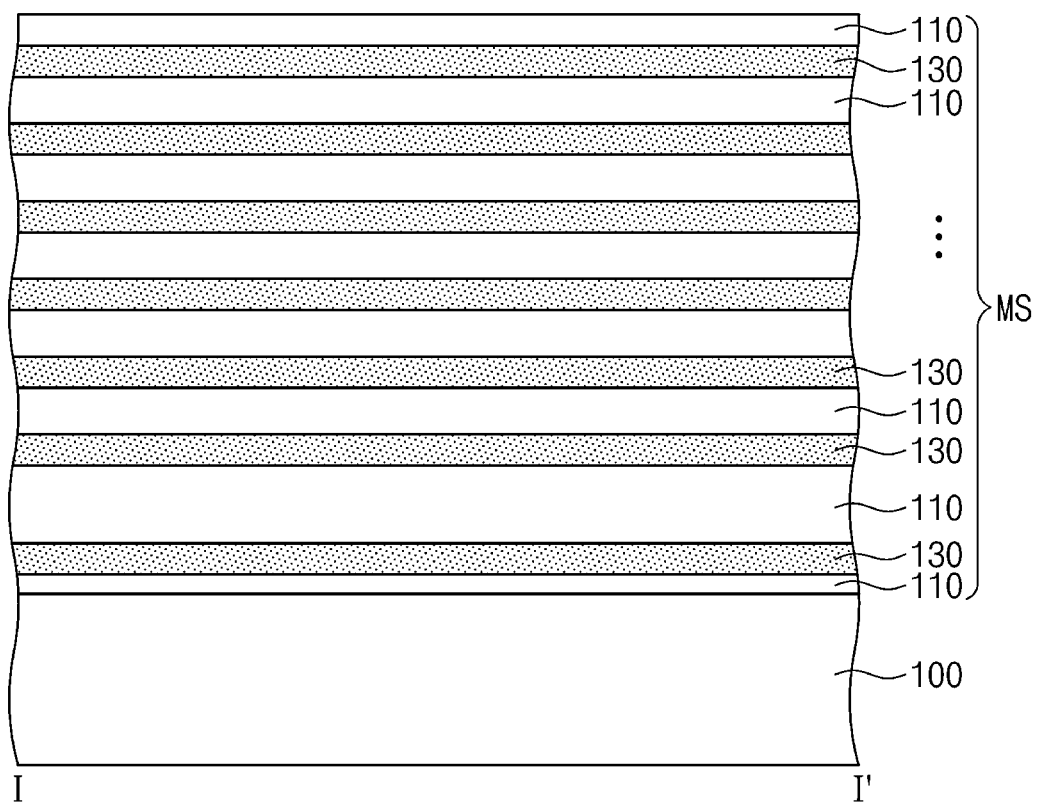
FIGS. 13 to 18 are cross-sectional views of a three-dimensional semiconductor memory device according to an embodiment of the inventive concept, and each corresponds to cross-section taken along line I-I' of FIG. 11.
Figure 13:
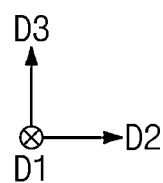

Referring to FIG. 13, a mold structure MS including interlayer dielectric layers 110 and sacrificial layers 130 alternately stacked on a substrate 100 may be formed. The interlayer dielectric layers 110 and the sacrificial layers 130 may be formed by, for example, a chemical vapor deposition method. However, the bottommost one of the interlayer dielectric layers 110 positioned between the bottommost one of the sacrificial layers 130 and the substrate 100 may be formed through a thermal oxidation process after the deposition process. The interlayer dielectric layers 110 may correspond to the interlayer dielectric layers ILD of FIG. 12.

The sacrificial layers 130 of the mold structure MS may include a material having etch selectivity with respect to the interlayer dielectric layers 110. For example, the sacrificial layers 130 may include silicon nitride, and the interlayer dielectric layers 110 may include silicon oxide.

Figure 14:
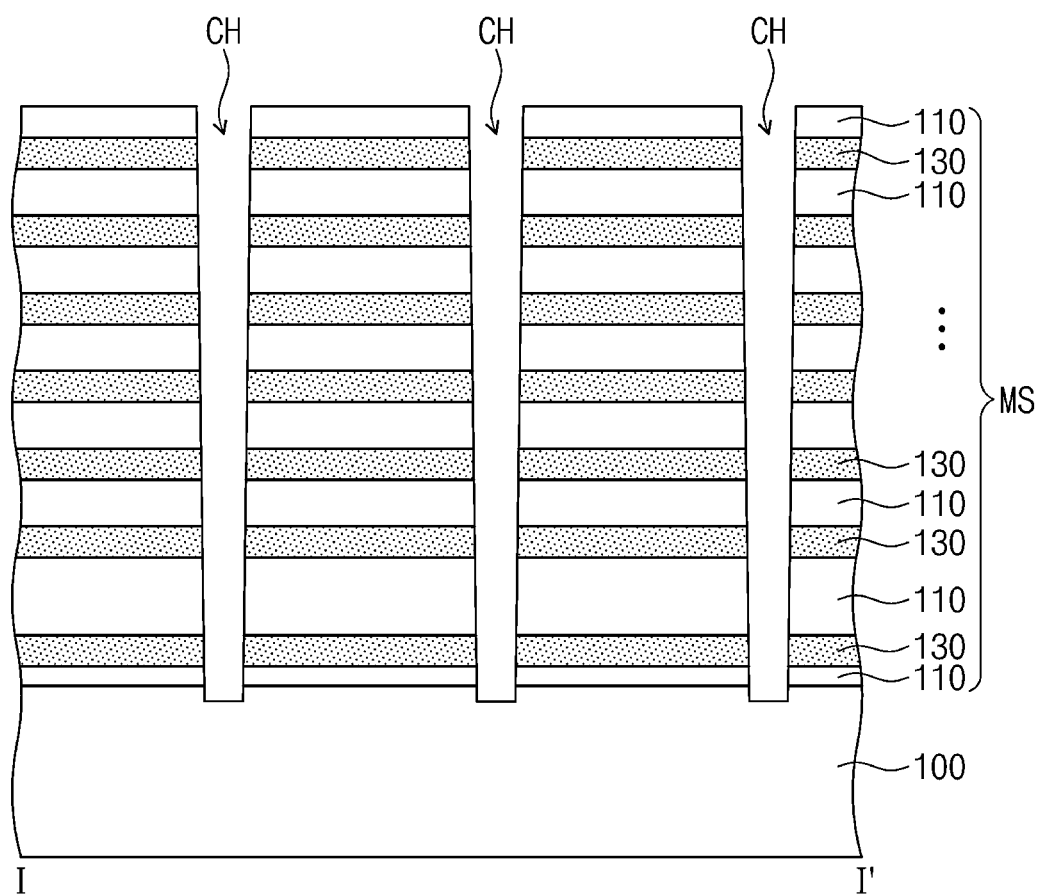
Figure 14:
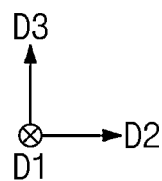

Referring to FIG. 14, channel holes CH penetrating the mold structure MS may be formed. The channel holes CH may recess a portion of the substrate 100 and expose an upper surface of the substrate 100. The channel holes CH may expose sidewalls of the interlayer dielectric layers 110 and the sacrificial layers 130.

The channel holes CH may be formed by forming a mask pattern on the mold structure MS and performing an anisotropic etching process using the mask pattern as an etch mask. The upper surface of the substrate 100 may be over-etched by the anisotropic etching process. The channel holes CH may have a plurality of columns, from a flat point of view of FIG. 11, and may be arranged in a zigzag shape.

Figure 15:
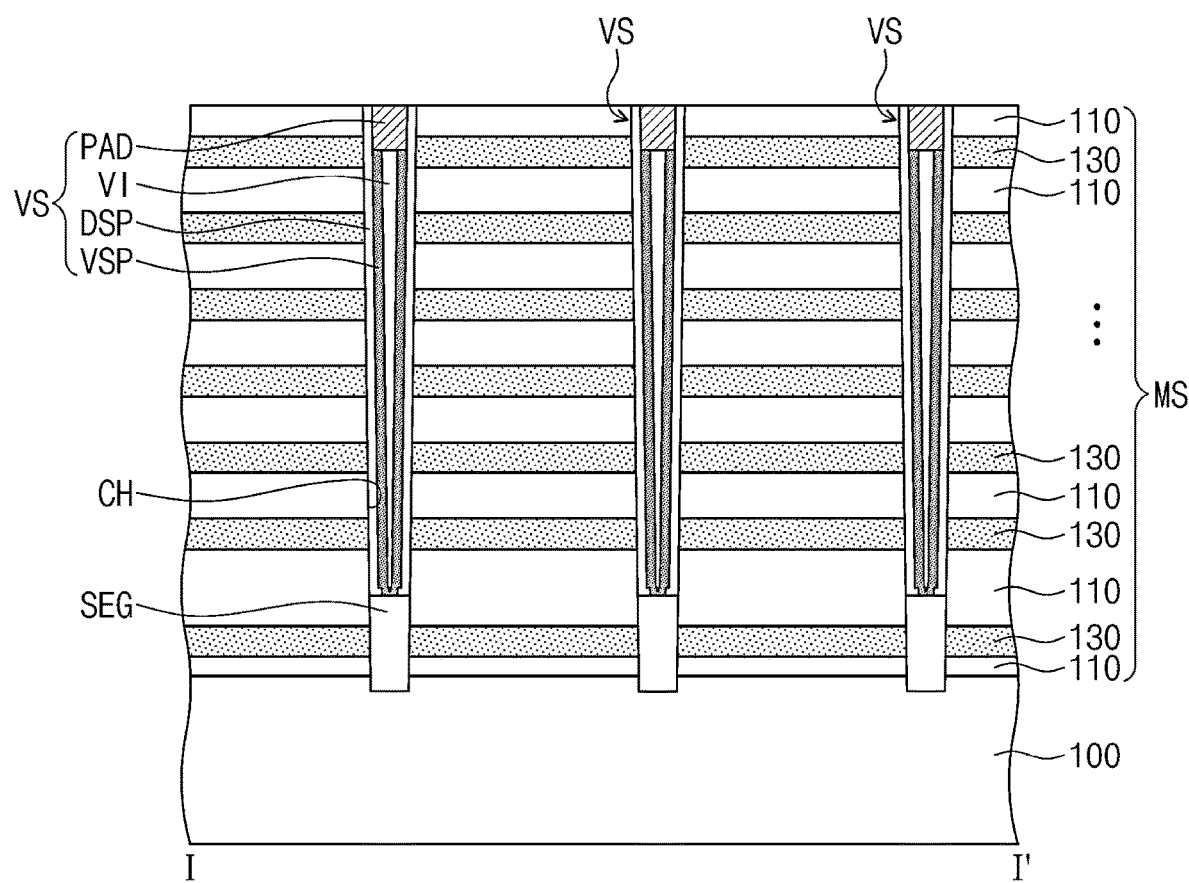

Referring to FIG. 15, lower epitaxial layers SEG and vertical channel structures VS may be formed in the channel holes CH. The lower epitaxial layers SEG may be formed by a selective epitaxial growth method.

Forming each of the vertical channel structures VS may include forming a data storage pattern DSP that conformally covers an inner sidewall of each of the channel holes CH, forming a vertical semiconductor pattern VSP that conformally covers a sidewall of the data storage pattern DSP, forming a buried insulating pattern VI that fills a space surrounded by an inner sidewall of the vertical semiconductor pattern VSP, and forming a conductive pad PAD on the buried insulating pattern VI.

The data storage pattern DSP may be formed in a single-layer structure including a ferroelectric material. The data storage pattern DSP may be formed of the same material as the oxide thin film 20 described with reference to FIGS. 1 and 2. The data storage pattern DSP may be formed of, for example, at least one of $HfO_x$, PZT ($Pb(Zr, Ti)O_3$), PTO ($PbTiO_3$), SBT ($SrBi_2Ti_2O_3$), BLT ($Bi(La, Ti)O_3$), PLZT ($Pb(La, Zr)TiO_3$), BST ($Bi(Sr, Ti)O_3$), barium titanate (BaTiO$_3$), P(VDF-TrFE), PVDF, $AlO_x$, $ZnO_x$, $TiO_x$, $TaO_x$, or $InO_x$, doped with at least one impurity of Al, Gd, Si, Y, Zr, Sr, Sc, Ge, Ce, Ca, La, Sn, Dy, or Er having an orthorhombic crystal structure.

The vertical semiconductor pattern VSP may be formed of, for example, an oxide semiconductor material including at least one of In, Zn, or Ga; or a Group IV semiconductor material, for example, a $ZnO_x$-based material including AZO, ZTO, IZO, ITO, IGZO, or Ag—ZnO.

As another example, the vertical semiconductor pattern VSP may be formed of a silicon-based material, for example, a semiconductor material doped with an impurity, an intrinsic semiconductor material in an undoped state, or a polycrystalline semiconductor material.

The data storage pattern DSP and the vertical semiconductor pattern VSP may be formed by a chemical vapor deposition method or an ALD method. The conductive pad PAD may be formed, for example, by recessing an upper portion of the vertical semiconductor pattern VSP and filling the recessed area with a doped semiconductor material or a conductive material.

Figure 16:
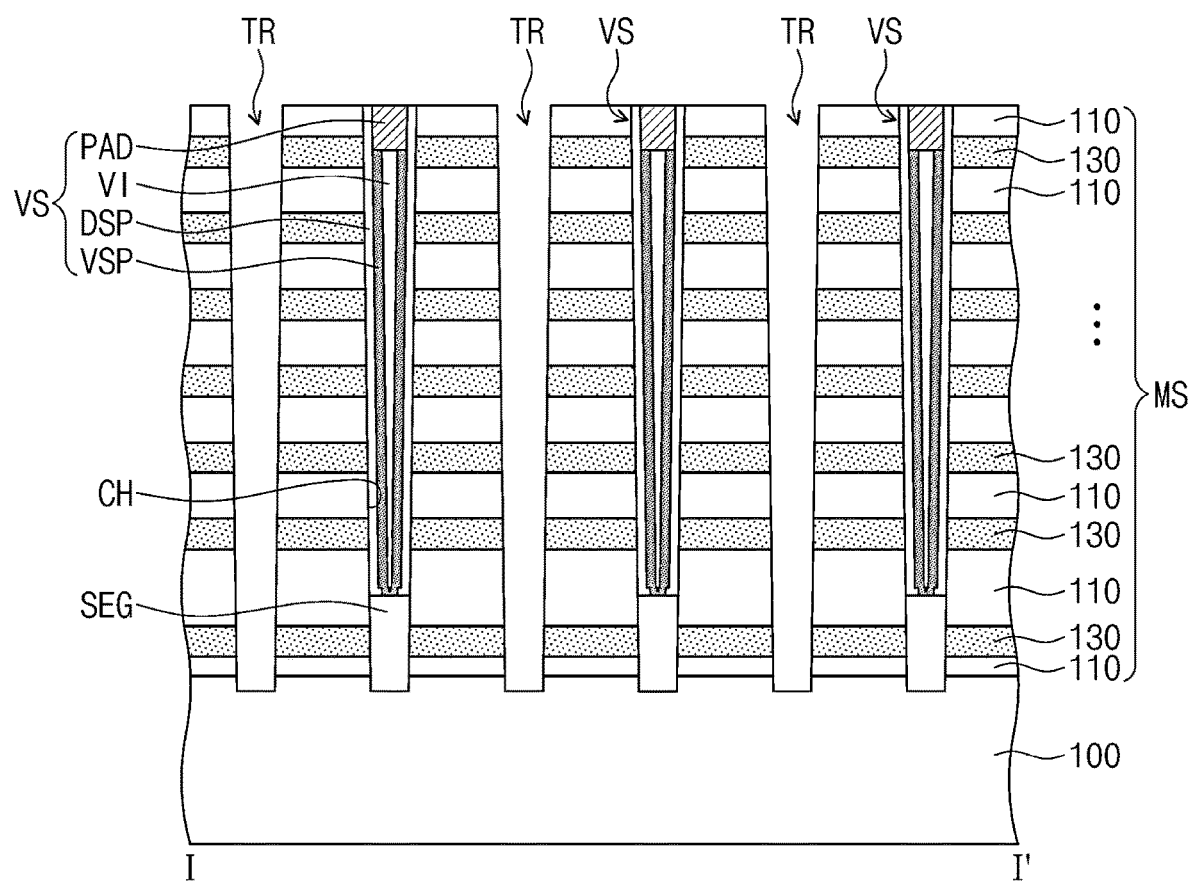
Figure 16:
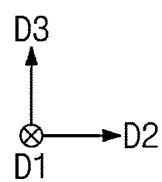

Referring to FIG. 16, an isolation trench TR penetrating the mold structure MS may be formed. The isolation trench TR may be horizontally spaced apart from the vertical channel structures VS. The isolation trench TR may recess a portion of the substrate 100 and expose an upper surface of the substrate 100. The isolation trench TR may expose sidewalls of the interlayer dielectric layers 110 and the sacrificial layers 130.

The isolation trench TR may be formed by forming a mask pattern on the mold structure MS and patterning the mold structure MS using the mask pattern as an etch mask. The upper surface of the substrate 100 may be over-etched by patterning. The isolation trench TR may have a line shape extending in the first direction D1 from a flat point of view of FIG. 11.

Figure 17:
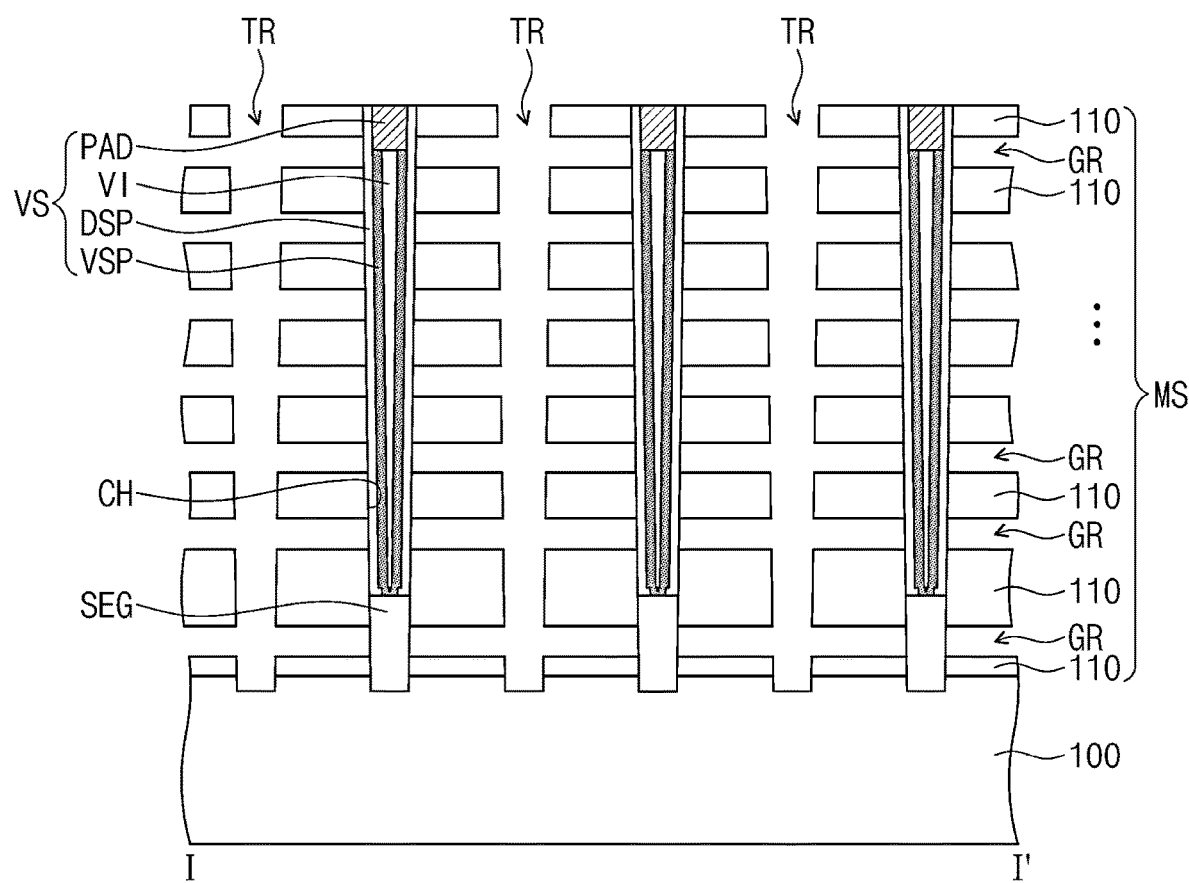

Referring to FIG. 17, the sacrificial layers 130 exposed by the isolation trench TR may be selectively removed. The selective removal of the sacrificial layers 130 may be performed through a wet etching process using an etching solution. For example, the sacrificial layers 130 may be selectively removed by an etching solution including hydrofluoric acid or phosphoric acid.

Spaces from which the sacrificial layers 130 are removed may be referred to as gate areas GR. The gate areas GR may be defined as areas horizontally extending from the isolation trench TR to the interlayer dielectric layers 110.

Figure 18:
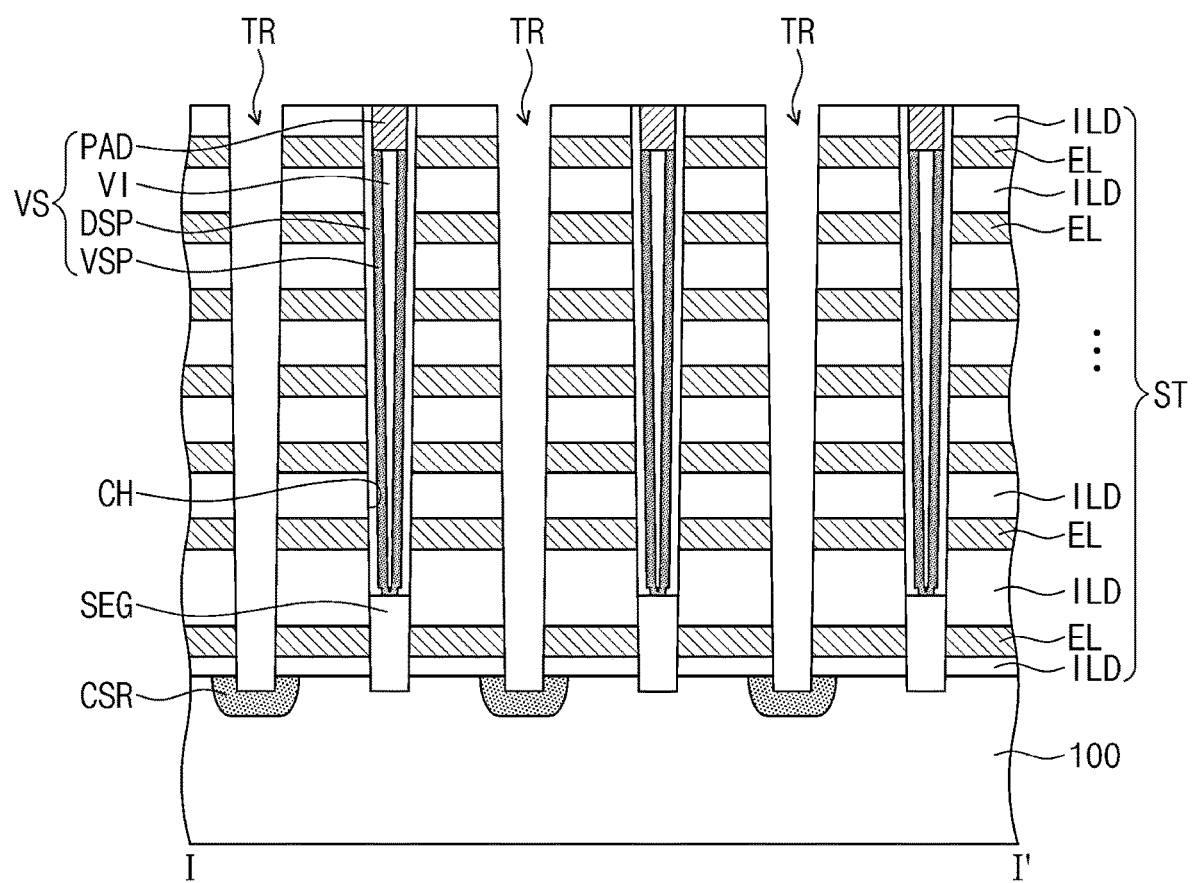
Figure 18:
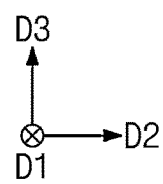

Referring to FIG. 18, channel holes CH penetrating the mold structure MS may be formed. The gate electrodes EL may be formed by forming a conductive film filling a portion of the gate areas GR and the isolation trench TR, and removing the conductive film formed in the isolation trench TR. The gate electrodes EL may be formed by, for example, a chemical vapor deposition method or an ALD method.

As the gate electrodes EL are formed, stack structures ST including gate electrodes EL and interlayer dielectric layers ILD that are alternately stacked in the third direction D3 perpendicular to the upper surface of the substrate 100 may be formed. From a flat point of view in FIG. 11, the stack structures ST may extend in the first direction D1, and may be arranged along the second direction D2, and may be spaced apart from each other in the second direction D2. A portion of the upper surface of the substrate 100 may be exposed between the stack structures ST adjacent to each other.

After forming the stack structures ST, a heat treatment process and a cooling process for the vertical channel structures VS may be performed. The heat treatment process and the cooling process may be substantially the same as the heat treatment process S200 and the cooling process S300 described with reference to FIGS. 1 and 2. By the heat treatment process and the cooling process, the data storage pattern DSP may have electrical and physical properties of the ferroelectric thin film manufactured according to the manufacturing method described with reference to FIGS. 1 and 2. The ferroelectricity of the data storage pattern DSP may be improved by the heat treatment process and the cooling process, and the electrical characteristics and reliability of the 3D semiconductor memory device according to the inventive concept may be improved. In some embodiments, a heat treatment process and a cooling process for the vertical channel structures VS may be performed after forming the common source plug CSP, which will be described later.

An upper surface of the substrate 100 exposed by the isolation trench TR may be doped with an impurity of a conductivity type different from that of the substrate 100, and accordingly, a common source area CSR may be formed in the substrate 100 between the stack structures ST adjacent to each other.

Referring to FIGS. 11 and 12 again, insulating spacers SP covering the sidewall of the isolation trench TR may be formed. The insulating spacers SP may be formed by conformally depositing a spacer layer on the substrate 100 and the stack structures ST and exposing the common source area CSR through an etch-back process. A common source plug CSP may be formed in an inner space of the isolation trench TR surrounded by the insulating spacers SP.

A capping insulating film 150 may be formed on the stack structures ST, the vertical channel structures VS, and the common source plug CSP. The capping insulating layer 150 may cover the upper surface of the topmost one of the interlayer dielectric layers ILD, the upper surface of the conductive pad PAD, and the upper surface of the common source plug CSP. Subsequently, a bit line contact plug BPLG may be formed through the capping insulating film 150 to be electrically connected to the conductive pad PAD. Subsequently, a bit line BL extending in the second direction D2 on the capping insulating film 150 and electrically connected to the bit line contact plug BPLG may be formed.

The method of manufacturing a ferroelectric thin film according to embodiments of the inventive concept may improve the ferroelectricity of the oxide thin film through a quenching-based process after heat treatment. The ferroelectric thin film manufactured according to the manufacturing method may better maintain the orthorhombic phase structure by a relatively fast cooling rate, and may have a high residual polarization $P_r$ value and a coercive electric field $E_c$ value, so that it may be used for a multi-bit memory element.

In addition, the 3D semiconductor memory device according to the embodiments of the inventive concept better maintains the orthorhombic phase structure and may include a data storage pattern of a single-layer structure having a high residual polarization $P_r$ value and a coercive electric field $E_c$ value, so that electrical characteristics and reliability may be improved.

Although the embodiments of the present invention have been described, it is understood that the present invention should not be limited to these embodiments but various changes and modifications can be made by one ordinary skilled in the art within the spirit and scope of the present invention as hereinafter claimed.

What is claimed is:

1. A method of manufacturing a three-dimensional semiconductor memory device including a ferroelectric thin film, the method comprising:
    forming a mold structure including interlayer dielectric layers and sacrificial layers alternately stacked on a substrate;
    forming channel holes penetrating the mold structure;
    forming vertical channel structures inside the channel holes;
    forming an isolation trench penetrating the mold structure and having a line shape extending in one direction;
    selectively removing the sacrificial layers exposed by the isolation trench;
    forming gate electrodes filling a space from which the sacrificial layers are removed; and
    performing a heat treatment process and a cooling process for the vertical channel structures,
    wherein the forming of the vertical channel structures comprises:
    forming a data storage pattern configured to conformally cover an inner sidewall of each of the channel holes; and
    forming a vertical semiconductor pattern covering a sidewall of the data storage pattern,
    wherein the data storage pattern is formed of a ferroelectric thin film having a single-layer structure,
    wherein a cooling rate of the cooling process is −180° C./sec to −90° C./sec.

2. The method of claim 1, wherein the cooling process is quenching the vertical channel structures.

3. The method of claim 2, wherein the quenching uses deionized water (DI water) from which ions are removed.

4. The method of claim 1, wherein the heat treatment process comprises heating to a first temperature for a first time interval and maintaining the first temperature for a second time interval.

5. The method of claim 4, wherein the first temperature is 350° C. to 900° C.,
    wherein a ramping rate of the heat treatment process is 17.5° C./sec to 45° C./sec.

6. The method of claim 1, wherein the heat treatment process and the cooling process are performed after the forming of the gate electrodes.

7. The method of claim 1, further comprising:
    forming a common source area in the substrate exposed by the isolation trench; and
    forming an insulating spacer covering a sidewall of the isolation trench and a common source plug filling an internal space of the isolation trench surrounded by the insulating spacer.

8. The method of claim 1, wherein the forming of the vertical channel structures further comprises recessing an upper portion of the vertical semiconductor pattern, and forming a conductive pad by filling a doped semiconductor material in a recessed area.

9. The method of claim 1, further comprising forming lower epitaxial layers in lower portions of the channel holes between the forming of the channel holes and the forming of the vertical channel structures.

* * * * *